US010876866B2

(12) United States Patent
Joodaki et al.

(10) Patent No.: US 10,876,866 B2
(45) Date of Patent: Dec. 29, 2020

(54) ANGULAR DISPLACEMENT SENSOR AND METHOD USING THEREOF

(71) Applicants: Mojtaba Joodaki, Mashhad (IR); Javad Basseri, Mashhad (IR)

(72) Inventors: Mojtaba Joodaki, Mashhad (IR); Javad Basseri, Mashhad (IR)

(\*) Notice: Subject to any disclaimer, the term of this patent is extended or adjusted under 35 U.S.C. 154(b) by 103 days.

(21) Appl. No.: 16/112,737

(22) Filed: Aug. 26, 2018

(65) Prior Publication Data

US 2018/0364074 A1 Dec. 20, 2018

Related U.S. Application Data

(60) Provisional application No. 62/551,796, filed on Aug. 30, 2017.

(51) Int. Cl.
*G01D 5/48* (2006.01)
*G01R 27/28* (2006.01)

(52) U.S. Cl.
CPC .............. *G01D 5/48* (2013.01); *G01R 27/28* (2013.01)

(58) Field of Classification Search
CPC .................................. G01D 5/48; G01P 3/44
See application file for complete search history.

(56) References Cited

U.S. PATENT DOCUMENTS 3,593,136 A \* 7/1971 Chapman ................. G01P 3/481
324/175
4,529,312 A 7/1985 Pavlath et al.
6,393,912 B2 \* 5/2002 Pchelnikov ........... G01F 23/284
324/167

(Continued)

FOREIGN PATENT DOCUMENTS

WO 8203456 A1 10/1982

OTHER PUBLICATIONS

Supakorn Harnsoongnoena and Niwat Angkawisittpan, Angular Displacement Sensor Based on Coplanar Waveguide (CPWs) Loaded with S-Shaped Golden Spiral-Tapered Split Ring Resonators (SGS-SRRs), Procedia Computer Science, 2016, pp. 75-78, vol. 86.

(Continued)

*Primary Examiner* — Noam Reisner
(74) *Attorney, Agent, or Firm* — Bajwa IP Law Firm; Haris Zaheer Bajwa

(57) ABSTRACT

A method for measuring angular displacement is disclosed. The method includes preparing a sensor, where the sensor includes a first semi-cylindrical dielectric rotatable relative to a rotation axis, a second semi-cylindrical dielectric fixed relative to the rotation axis, and a transmission line that is located between the first semi-cylindrical dielectric and the second semi-cylindrical dielectric. The first semi-cylindrical dielectric includes a first plurality of periodic air-gaps and the second semi-cylindrical dielectric includes a second plurality of periodic air-gaps. The method further includes sending a radio frequency (RF) signal with a single central frequency to the transmission line, putting the first semi-cylindrical dielectric in contact with a rotating object, displacing a position of a reference air-gap of the first plurality of periodic air-gaps relative to the second plurality of periodic air-gaps responsive to an angular displacement of the rotating object, and determining the angular displacement of the rotating object.

20 Claims, 16 Drawing Sheets

(56) References Cited

U.S. PATENT DOCUMENTS

| | | |
|---|---|---|
| 7,782,066 B2 | 8/2010 | Joodaki |
| 2008/0142911 A1* | 6/2008 | Berlin .................. G01P 15/00 257/414 |
| 2017/0003146 A1* | 1/2017 | Liu .......................... G01B 7/30 |

OTHER PUBLICATIONS

Jordi Naqui et al., Angular Displacement and Velocity Sensors Based on Coplanar Waveguides (CPWs) Loaded with S-Shaped Split Ring Resonators (S-SRR), Sensors, 2015, pp. 9628-9650, vol. 15.

Jordi Naqui et al., Transmission Lines Loaded with Bisymmetric Resonators and Their Application to Angular Displacement and Velocity Sensors, IEEE Transactions on Microwave Theory and Techniques, Dec. 2013, pp. 4700-4713, vol. 61, No. 12.

Mojtaba Joodaki and Morteza Rezaee, Coplanar Waveguide (CPW) Loaded with an Electromagnetic Band Gap (EBG) Structure: Modeling and Application to Displacement Sensor, IEEE Sensors, 2015, May 1, 2016, pp. 3034-3040, vol. 16, Issue: 9.

Morteza Rezaee and Mojtaba Joodaki, Two-Dimensional Displacement Sensor Based on CPW Line Loaded by Defected Ground Structure (DGS) with Two Separated Transmission Zeroes, IEEE Sensors, 2017, pp. 994-999, vol. 17, Issue: 4.

Yongzhuo Zoul et al., Compact coplanar waveguide low-pass filter using a novel electromagnetic bandgap structure, 2006 7th International Symposium on Antennas, Propagation & EM Theory, Oct. 26-29, 2006.

João Marcos Salvi Sakamoto et al., High sensitivity fiber optic angular displacement sensor and its application for detection of ultrasound, Applied Optics, Jul. 10, 2012, pp. 4841-4851, vol. 51, No. 20.

Seoktae Kim and Cam Nguyen, A Displacement Measurement Technique Using Millimeter-Wave Interferometry, IEEE Transactions on Microwave Theory and Techniques, Jun. 2003, pp. 1724-1728, vol. 51, No. 6.

Javad Basseri and Mojtaba Joodaki, Realization of a Low Cost Displacement Sensor on PCB with Two-Metal-Layer Coplanar Waveguide Loaded by an EBG Structure, IEEE Sensors, Aug.1, 1 2017, pp. 4797-4804, vol. 17, Issue: 15.

* cited by examiner

ANGULAR DISPLACEMENT SENSOR AND METHOD USING THEREOF

CROSS-REFERENCE TO RELATED APPLICATION

This application claims the benefit of priority from U.S. Provisional Patent Application Ser. No. 62/551,796 filed on Aug. 30, 2017, and entitled "ANGULAR DISPLACEMENT SENSOR", which is incorporated herein by reference in its entirety.

TECHNICAL FIELD

The present disclosure generally relates to sensors, and particularly, to angular displacement sensors.

BACKGROUND

Microwave sensors for measuring spatial variables such as displacement, rotation and alignment have gained more traction due to their special characteristics. These sensors offer characteristics such as smaller size, higher accuracy, and better resolution in comparison with direct current (DC) or low frequency sensors. These sensors are based on different physical principles such as employing resonators, electromagnetic bandgap (EBG), and defected ground structures (DGS). A majority of microwave displacement or angular displacement sensors utilize coupling of a resonator and a transmission line, such as tapered horn-shaped resonator, golden spiral-shaped tapered ring resonator, Electric-LC (ELC) structure, stepped impedance resonator (SIR), and S-Shaped Split Ring Resonators (S-SRR). These kinds of sensors often need to sweep a frequency over a specific band, to acquire the displacement data, and may suffer from issues in lower bandwidths which may need more complicated measuring circuits. Therefore, these sensors need complex equipment such as VNA (Vector Network Analyzer) to sweep the input microwave signal frequency range.

Electromagnetic bandgap (EBG) structures are periodic structures, which do not allow electromagnetic waves to pass through specific frequency bands. This phenomenon may be used for fabrication of microwave displacement sensors with coplanar waveguide (CPW) loaded by EBG structures. The modeling, simulation and analyses of these types of sensors have been presented and fabrication processes on silicon substrate and radio frequency (RF) laminates have been proposed. However, it seems that design and fabrication of an angular displacement sensor utilizing an EBG structure and a CPW in a planar circular shape may be associated with issues such as difficult fabrication process, asymmetric ground paths caused by bending the CPW on a planar substrate to shape a circular or semi-circular structure; and thus, stimulating the odd mode signals in the transmission line.

Therefore, there is a need for a method, a sensor, and a system for angular displacement measurements utilizing an EBG structure loaded on a CPW that may benefit from the advantages of both CPW and EBG in angular displacement measurements, while exemplary sensor and exemplary system may overcome the aforementioned difficulties. More specifically, there is a need for a sensor and a system for angular displacement measurements that may be fabricated through a simple and low-cost fabrication process. Moreover, there is a need for a sensor and a system for angular displacement measurements that do not involve stimulation of an odd mode and may work at a single frequency without necessity of sweeping a range of frequency.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes a method for measuring angular displacement. The method may include preparing a sensor, where the sensor may include a first semi-cylindrical dielectric rotatable relative to a rotation axis, a second semi-cylindrical dielectric fixed relative to the rotation axis, and a transmission line that may be located between the first semi-cylindrical dielectric and the second semi-cylindrical dielectric. In an exemplary embodiment, the first semi-cylindrical dielectric may include a first plurality of periodic air-gaps and the second semi-cylindrical dielectric may include a second plurality of periodic air-gaps. The method may further include sending a radio frequency (RF) signal with a single central frequency to the transmission line, putting the first semi-cylindrical dielectric in contact with a rotating object, displacing a position of a reference air-gap of the first plurality of periodic air-gaps relative to the second plurality of periodic air-gaps responsive to an angular displacement of the rotating object, and determining the angular displacement of the rotating object.

In an exemplary implementation, determining the angular displacement of the rotating object may include measuring an output power from the transmission line, calculating a radial displacement ($\Delta\alpha$ rotation) of the reference air-gap using a look-up semi-empirical curve of the output power versus $\Delta\alpha$, counting a number of air-gaps of the second plurality of periodic air-gaps passed by the reference air-gap responsive to displacing the position of the reference air-gap of the first plurality of periodic air-gaps relative to the second plurality of periodic air-gaps, determining a direction of the angular displacement, and calculating the angular displacement of the rotating object based on the $\Delta\alpha$ rotation, the number of passed air-gaps, and the direction of the angular displacement. In an exemplary embodiment, measuring the output power from the transmission line may include detecting an amount of insertion loss through the transmission line at the single central frequency.

In an exemplary implementation, preparing the sensor may include fabricating the transmission line that may include preparing two metal layers, putting a dielectric interlayer between the two metal layers, and bending the transmission line. In an exemplary embodiment, each metal layer may include a signal trace and a pair of ground traces. Preparing the sensor may further include fabricating the first semi-cylindrical dielectric and the second semi-cylindrical dielectric by laser cutting of a dielectric, placing the first semi-cylindrical dielectric adjacent to a first side of the transmission line, and fixing the second semi-cylindrical dielectric on a second side of the transmission line. In an exemplary embodiment, bending the transmission line may include bending the transmission line with a curvature less than 50 m$^{-1}$.

In an exemplary implementation, sending the RF signal with a single central frequency to the transmission line may include sending a RF signal with a constant central frequency between 1 GHz and 30 GHz using at least one of a vector network analyzer (VNA) and a voltage-controlled oscillator (VCO).

In another aspect, the present disclosure describes an exemplary sensor for measuring angular displacement. The exemplary sensor may include a transmission line that may be configured to receive an input signal and send an output power. In an exemplary embodiment, the transmission line may include two curved metal layers, and a dielectric interlayer between the two curved metal layers. The exemplary sensor may further include a semi-cylindrical dielectric structure that may include a first semi-cylindrical dielectric configured to rotate around a rotation axis responsive to an angular displacement of an object, and a second semi-cylindrical dielectric fixed relative to the rotation axis. In an exemplary embodiment, the first semi-cylindrical dielectric may include a first plurality of periodic air-gaps, and the second semi-cylindrical dielectric may include a second plurality of periodic air-gaps. Where, the transmission line may be located between the first semi-cylindrical dielectric and the second semi-cylindrical dielectric.

In an exemplary implementation, the two curved metal layers may include a first metal layer, and a second metal layer. The first metal layer may include a first signal trace and a first pair of ground traces, and the second metal layer may include a second signal trace that may be connected to the first signal trace, and a second pair of ground traces. Where, each ground trace of the second pair of ground traces may be connected to a corresponding ground trace of the first pair of ground traces.

In an exemplary implementation, the first signal trace may be located opposite to the second signal trace, and each ground trace of the second pair of ground traces may be located opposite to the corresponding connected ground trace of the first pair of ground traces. In an exemplary embodiment, respective lengths of the first signal trace, the second signal trace, each ground trace of the first pair of ground traces, and each ground trace of the second pair of ground traces may include the same length. In an exemplary embodiment, the dielectric interlayer may include a layer of flexible high-frequency Teflon-based material curved between two curved metal layers.

In an exemplary implementation, each two adjacent air-gaps of the first plurality of periodic air-gaps may be equally spaced apart with the same distance between each two adjacent air-gaps of the second plurality of periodic air-gaps. In an exemplary embodiment, each air-gap of the first plurality of periodic air-gaps and each air-gap of the second plurality of periodic air-gaps may include the same length.

In an exemplary implementation, a curvature of the transmission line may be defined by: $C=(2\sqrt{(6(L-X))})/(L\sqrt{L})$, where C may be the curvature of the transmission line, L may be the length of the transmission line, and X may be the straight distance between the two ends of the transmission line. In an exemplary embodiment, a curvature of the transmission line may include a magnitude less than 50 $m^{-1}$. In another exemplary embodiment, the magnitude may include more than 20 $m^{-1}$.

In an exemplary embodiment, the input signal may include a radio frequency signal with a single central frequency between 1 GHz and 30 GHz. The output power may include insertion loss through the transmission line at the single central frequency.

In an exemplary implementation, the sensor may further include a first coaxial RF connector at a first end of the transmission line and a second coaxial RF connector at a second end of the transmission line. The first coaxial RF connector may be configured to connect the transmission line to at least one of a vector network analyzer (VNA) and a voltage-controlled oscillator (VCO), and the second coaxial RF connector may be configured to connect the transmission line to a power detector.

In another aspect, the present disclosure describes an exemplary system for measuring angular displacement. The exemplary system may include a sensor that may include a semi-cylindrical dielectric structure and a transmission line. The semi-cylindrical dielectric structure may include a first semi-cylindrical dielectric configured to rotate around a rotation axis responsive to an angular displacement of a rotating object, and a second semi-cylindrical dielectric fixed relative to the rotation axis. In an exemplary embodiment, the first semi-cylindrical dielectric may include a first plurality of periodic air-gaps, and the second semi-cylindrical dielectric may include a second plurality of periodic air-gaps. The transmission line may be located between the first semi-cylindrical dielectric and the second semi-cylindrical dielectric. In an exemplary embodiment, the transmission line may be configured to receive an input signal and send an output power.

In an exemplary implementation, exemplary system may further include a voltage-controlled oscillator (VCO) that may be connected to the sensor, a power detector that may be connected to the sensor, a potentiometer that may be coupled to the sensor, a counter that may be connected to the power detector, and an output circuit that may be connected to the power detector, the potentiometer, and the counter.

In an exemplary implementation, the VCO may be configured to send the input signal including a radio frequency (RF) signal with a single central frequency to the transmission line. The power detector may be configured to receive the output power from the transmission line at the single central frequency. The potentiometer may be configured to determine a direction of the angular displacement of the rotating object. The counter may be configured to count a number of air-gaps of the second plurality of periodic air-gaps passed by a reference air-gap of the first plurality of periodic air-gaps responsive to the angular displacement of the rotating object. The output circuit may be configured to calculate the angular displacement of the rotating object based on the output power, the direction of the angular displacement, and the number of passed air-gaps.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

Figure 1A:
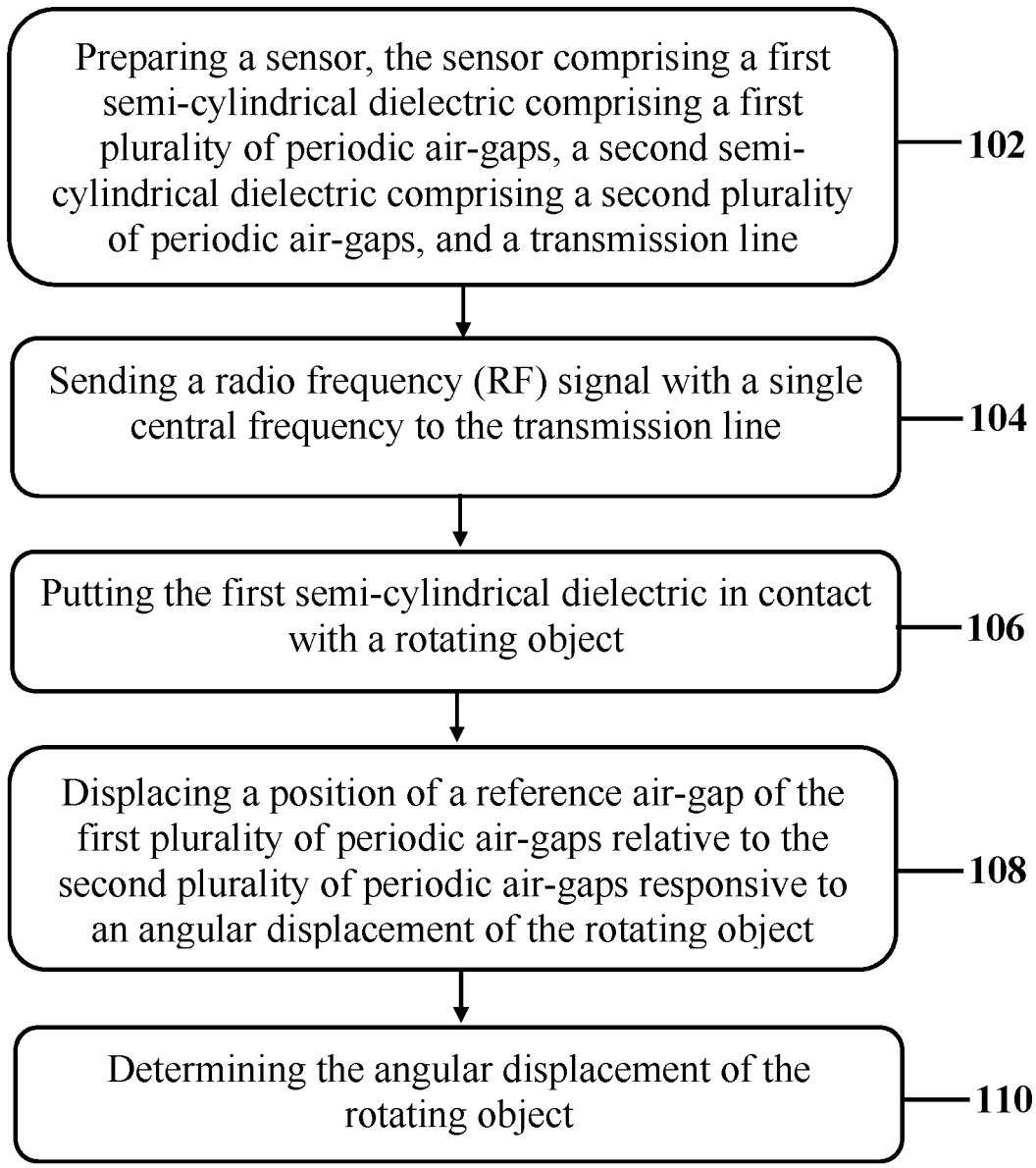
FIG. 1A illustrates an exemplary method for measuring angular displacement, consistent with one or more exemplary embodiments of the present disclosure.

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings. The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Herein, an exemplary microwave angular displacement sensor and an exemplary method of utilizing exemplary sensor for measuring angular displacements is disclosed. The exemplary sensor may include a two-metal-layer (TML) coplanar waveguide (CPW) (TML-CPW) as a low-loss transmission line that may be loaded by a periodic air-gap structure as an electromagnetic bandgap (EBG) structure. In order to facilitate the realization of the angular displacement sensor on low-cost radio frequency (RF) laminates, a curved TML CPW may be implemented that may be suitable for measuring angular displacements. The EBG structure may include two semi-cylindrical periodic air-gap (air-hole) dielectrics made of a dielectric. Exemplary semi-cylindrical periodic air-gap dielectrics may be allocated on two sides (at top and bottom) of the transmission line.

In some implementations, by rotating one of the semi-cylindrical dielectrics against the other one, a variation may be produced in depth of the stopband at the central frequency that may be sent to the transmission line. The change in magnitude of the depth of the stopband may be proportional to the angle of the rotation. The fixed operating frequency and the wide bandwidth of an exemplary sensor (more than about 1 GHz) may simplify the design and fabrication of a corresponding data readout circuit in comparison with other types of angular displacement sensors. Exemplary data readout circuit may be utilized as an exemplary system including an exemplary sensor for measuring angular displacement.

Exemplary sensor may be fabricated using a simple and low-cost fabrication process. The structure of an exemplary sensor may not only exhibit an outstanding performance, but it may be robust against environmental noise and easy to use. Lower cost, easy fabrication, lower conductor loss, fixed operating frequency, wide bandwidth and dynamic range, higher operating frequency, acceptable linearity and high sensitivity may be the main properties of an exemplary sensor.

FIG. 1A shows an exemplary method 100 for measuring angular displacement, consistent with one or more exemplary embodiments of the present disclosure. Exemplary method 100 may include preparing a sensor (step 102), where the sensor may include a first semi-cylindrical dielectric that may be rotatable relative to a rotation axis, a second semi-cylindrical dielectric that may be fixed relative to the rotation axis, and a transmission line that may be located or placed between the first semi-cylindrical dielectric and the second semi-cylindrical dielectric. In exemplary embodiments, as described in further detail below, the first semi-cylindrical dielectric may include a first plurality of periodic air-gaps, and the second semi-cylindrical dielectric may include a second plurality of periodic air-gaps. Additionally, exemplary method 100 may further include sending a radio frequency (RF) signal with a single central frequency to the transmission line (step 104), putting the first semi-cylindrical dielectric in contact with a rotating object (step 106), displacing a position of a reference air-gap of the first plurality of periodic air-gaps relative to the second plurality of periodic air-gaps responsive to an angular displacement of the rotating object (step 108), and determining the angular displacement of the rotating object (step 110).

Figure 2A:
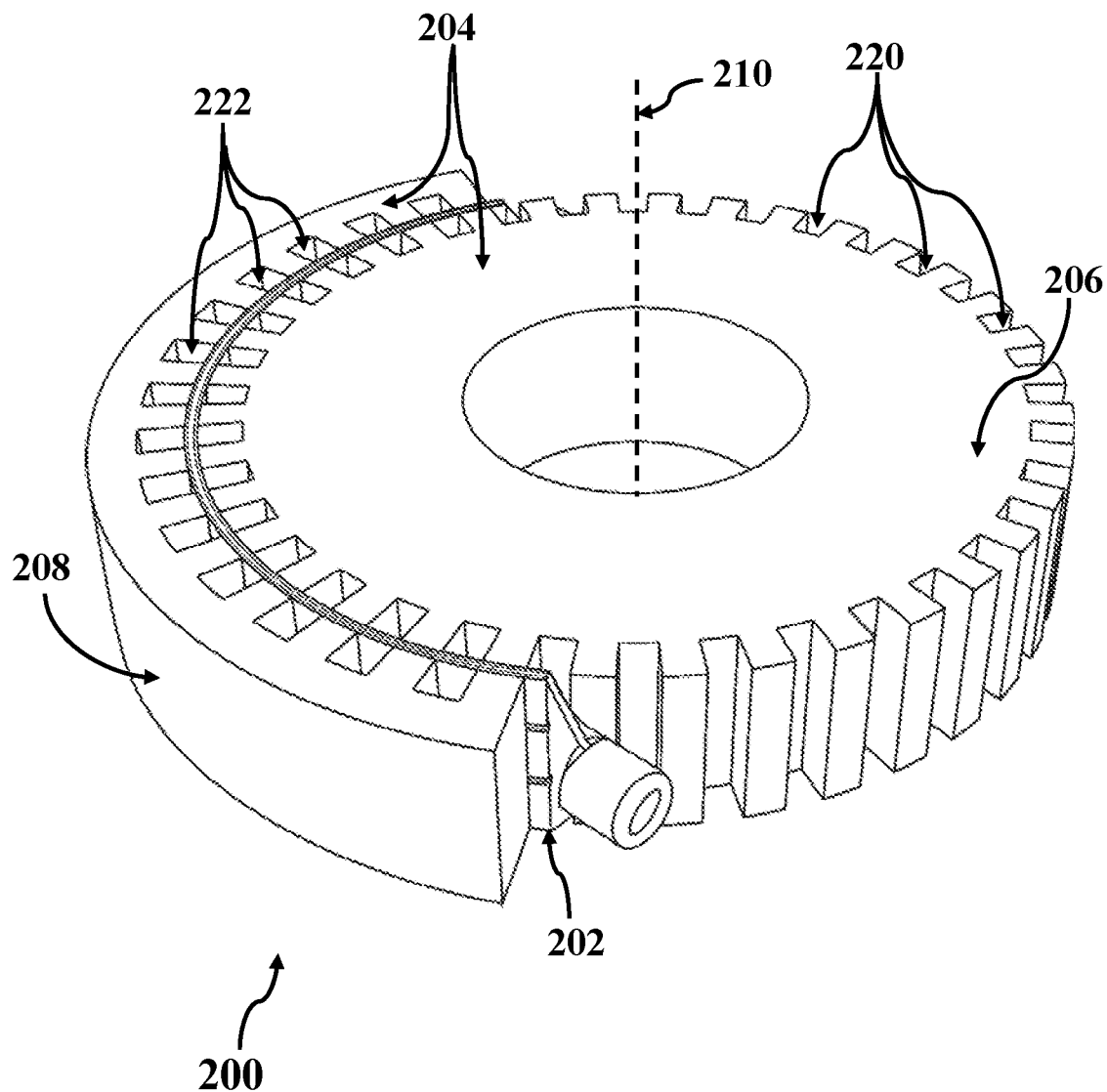
FIG. 2A illustrates a schematic view of an exemplary sensor that may be utilized for measuring angular displacement, consistent with one or more exemplary embodiments of the present disclosure.
Figure 2B:
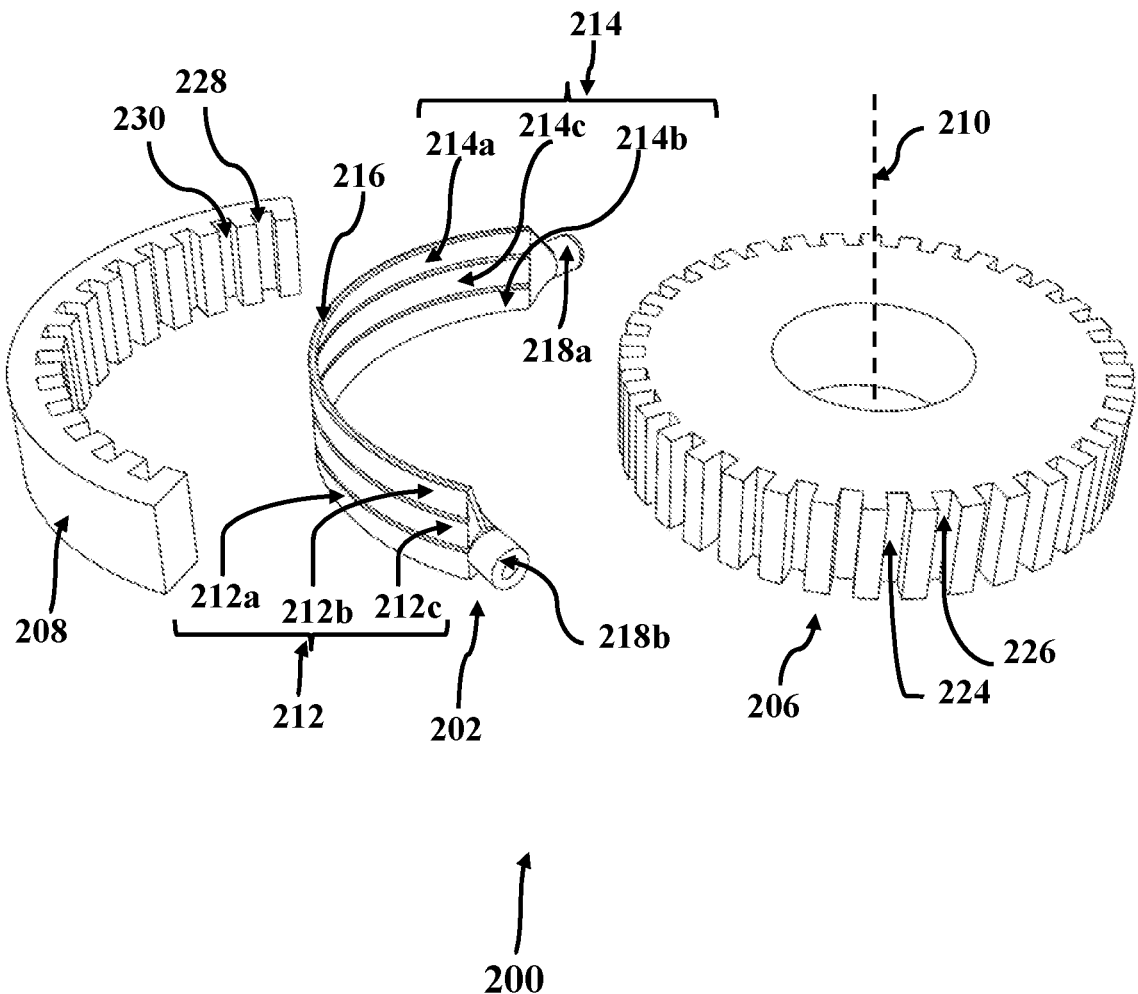
FIG. 2B illustrates a schematic exploded view of an exemplary sensor for measuring angular displacement, consistent with one or more exemplary embodiments of the present disclosure.

In detail, step 102 may include preparing a sensor, for example, exemplary sensor 200 of FIG. 2A. FIG. 2A shows a schematic view of exemplary sensor 200 that may be utilized for measuring angular displacement, consistent with one or more exemplary embodiments of the present disclosure. Additionally, FIG. 2B shows a schematic exploded view of exemplary sensor 200 for measuring angular displacement, consistent with one or more exemplary embodiments of the present disclosure. Exemplary sensor 200 may include a first semi-cylindrical dielectric 206 that may be rotatable relative to a rotation axis 210, a second semi-cylindrical dielectric 208 that may be fixed relative to rotation axis 210, and a transmission line 202 that may be located or placed between the first semi-cylindrical dielectric 206 and the second semi-cylindrical dielectric 208. In exemplary embodiments, as described in further detail below, the first semi-cylindrical dielectric 206 may include a first plurality of periodic air-gaps 220, and the second semi-cylindrical dielectric 208 may include a second plurality of periodic air-gaps 222.

In an exemplary embodiment, sensor 200 may include a transmission line 202 and a semi-cylindrical dielectric structure 204, where transmission line 202 may be located in a curved shape within semi-cylindrical dielectric structure 204. Exemplary transmission line 202 may form a coplanar waveguide (CPW) 202. Exemplary transmission line 202 may be configured to receive an input signal and send an output power. Furthermore, semi-cylindrical dielectric structure 204 may form an electromagnetic bandgap (EBG) structure 204, which may be loaded on CPW 202.

In an exemplary implementation, transmission line 202 may include two curved metal layers 212 and 214 that may include a first metal layer 212 and a second metal layer 214. Additionally, transmission line 202 may include a dielectric interlayer 216 that may be located between two curved metal layers 212 and 214.

Figure 1B:
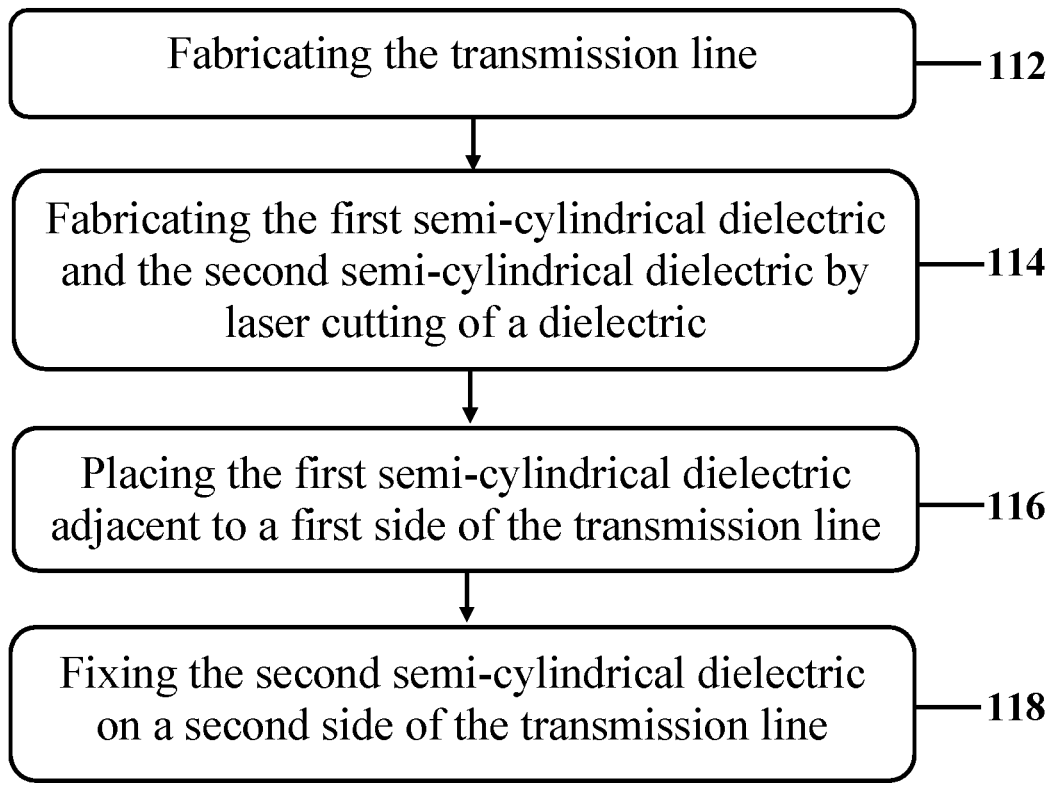
FIG. 1B illustrates an exemplary implementation process for preparing an exemplary sensor, consistent with one or more exemplary embodiments of the present disclosure.

FIG. 1B shows an exemplary implementation process for preparing exemplary sensor 200 (step 102), consistent with one or more exemplary embodiments of the present disclosure. Preparing sensor 200 may include fabricating transmission line 202 (step 112), fabricating the first semi-cylindrical dielectric 206 and the second semi-cylindrical dielectric 208 by laser cutting of a dielectric (step 114), placing the first semi-cylindrical dielectric 206 adjacent to a first side of transmission line 202 (step 116), and fixing the second semi-cylindrical dielectric 208 on a second side of transmission line 202 (step 118).

In an exemplary implementation, fabricating transmission line 202 (step 112) may include preparing two metal layers 212 and 214, putting dielectric interlayer 216 between two metal layers 212 and 214, and bending transmission line 202. Referring to FIG. 2B, the first metal layer 212 may include a first signal trace 212c and a first pair of ground traces 212a and 212b. In addition, the second metal layer 214 may include a second signal trace 214c and a second pair of ground traces 214a and 214b.

Figure 3:
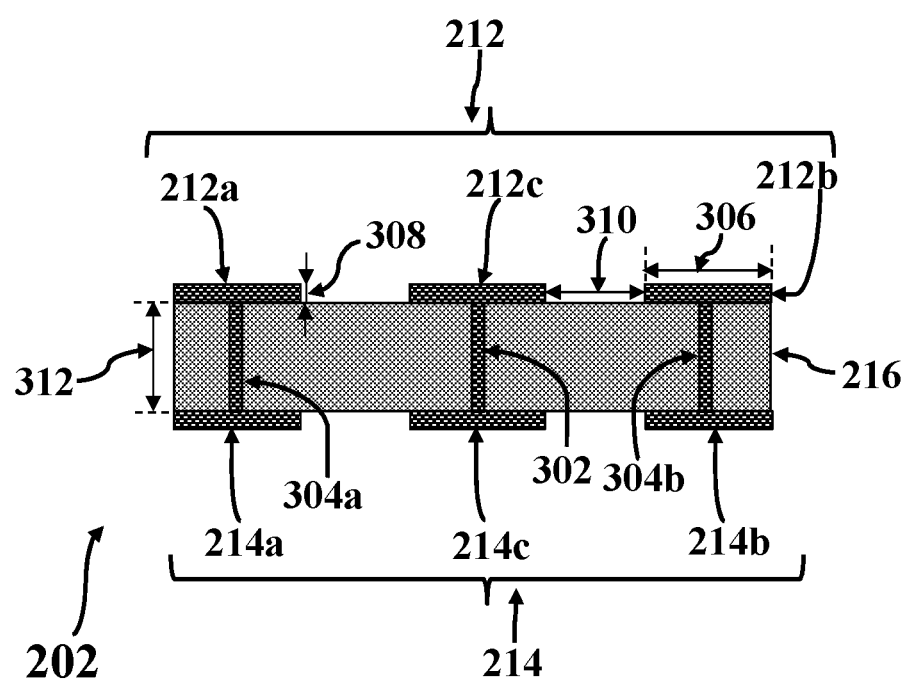
FIG. 3 illustrates a schematic cross-sectional view of an exemplary transmission line, consistent with one or more exemplary embodiments of the present disclosure.

In an exemplary embodiment transmission line 202 that may be fabricated in step 112, may have an exemplary cross-sectional view shown in FIG. 3. FIG. 3 shows a schematic cross-sectional view of exemplary transmission line 202, consistent with one or more exemplary embodiments of the present disclosure. In an exemplary embodiment, the first signal trace 212c may be positioned opposite to the second signal trace 214c, and the first signal trace 212c may be connected to the second signal trace 214c via a connector 302. In an exemplary embodiment, each ground trace of the first pair of ground traces 212a and 212b may be located or placed opposite and connected to each counterpart of the second pair of ground traces 214a and 214b. For example, ground trace 212a may be positioned opposite to its corresponding ground trace 214a, while connecting to each other via connector 304a. In addition, ground trace 212b may be positioned opposite to its corresponding ground trace 214b, while connecting to each other via connector 304b.

In an exemplary embodiment, an adequate number of exemplary connectors 302, 304a, and 304b may be utilized far from the edges of two metal layers 212 and 214 (with respect to the surface depth) to connect two metal layers 212 and 214, which may result in preventing unwanted modes stimulations, for example, odd modes during an angular displacement measurement process.

In an exemplary embodiment, the first signal trace 212c, the second signal trace 214c, and each ground trace 212a, 212b, 214a and 214b may include the same lengths 306. In an exemplary embodiment, transmission line 202 with a structure shown in FIG. 3 and described in detail herein above may benefit from a low loss and a high mechanical stability for realization of sensor 200 on a printed circuit board (PCB) using a simple PCB fabrication process for fabricating transmission line 202.

In an exemplary embodiment, the two metal layers 212 and 214 may have a thickness 308 shown in FIG. 3. Furthermore, each signal trace and ground trace of each metal layer, for example, the first signal trace 212c and ground trace 212b may have a distance 310 from each other. In an exemplary embodiment, an air-space with distance 310 may be between each signal trace and ground trace of the first metal layer 212 or the second metal layer 214.

In an exemplary implementation, step 112 may result in forming exemplary dielectric interlayer 216 between two curved metal layers 212 and 214, so that dielectric interlayer 216 may be curved along the two curved metal layers 212 and 214. In an exemplary embodiment, dielectric interlayer 216 material may be utilized to minimize an error due to loss of an output power passing through transmission line 202. Since exemplary sensor 200 may be utilized based on insertion loss measurements, a dielectric interlayer 216 made of high-frequency materials may be used to reduce an amount of insertion loss due passing through transmission line 202; thereby, resulting in minimizing of errors in insertion loss measurements.

In an exemplary implementation, two metal layers 212 and 214, and dielectric interlayer 216 may be made of flexible high-frequency materials that may allow for utilizing of transmission line 202 in exemplary sensor 200 for measuring angular displacements at high frequencies. In an exemplary embodiment, dielectric interlayer 216 may include a layer of flexible high-frequency Teflon-based material Teflon curved between two curved metal layers 212 and 214. Using a flexible material as exemplary dielectric interlayer 216 may provide curving dielectric interlayer 216 along with two metal layers 212 and 214 with a desirable curvature as described in detail herein below.

In an exemplary implementation, transmission line 202 may further include two coaxial RF connectors 218a and 218b at two ends of transmission line 202. In an exemplary embodiment, a first coaxial RF connector 218a may allow for connecting transmission line 202 to at least one of a vector network analyzer (VNA), and a voltage-controlled oscillator (VCO) to receive the input signal from the VNA or the VCO. Additionally, a second coaxial RF connector 218b may allow for connecting transmission line 202 to a power detector to send the output power of transmission line 202 to the power detector.

In an exemplary implementation, fabricating transmission line 202 (step 112) may further include fitting the first coaxial RF connector 218a at a first end of transmission line 202, and fitting the second coaxial RF connector 218b at a second end of transmission line 202. In an exemplary implementation, two coaxial RF connectors 218a and 218b may provide an access to transmission line 202 for sending and receiving RF signals. In an exemplary embodiment, two coaxial RF connectors 218a and 218b may include two SubMiniature version A (SMA) connectors 218a and 218b.

In an exemplary implementation, bending transmission line 202 may include bending transmission line 202 with a pre-determined curvature. In one implementation, a curvature of transmission line 202 may be calculated and designed appropriately, so that the curvature of transmission line 202 may have no considerable effect on electrical behavior of transmission line 202.

Figure 4:
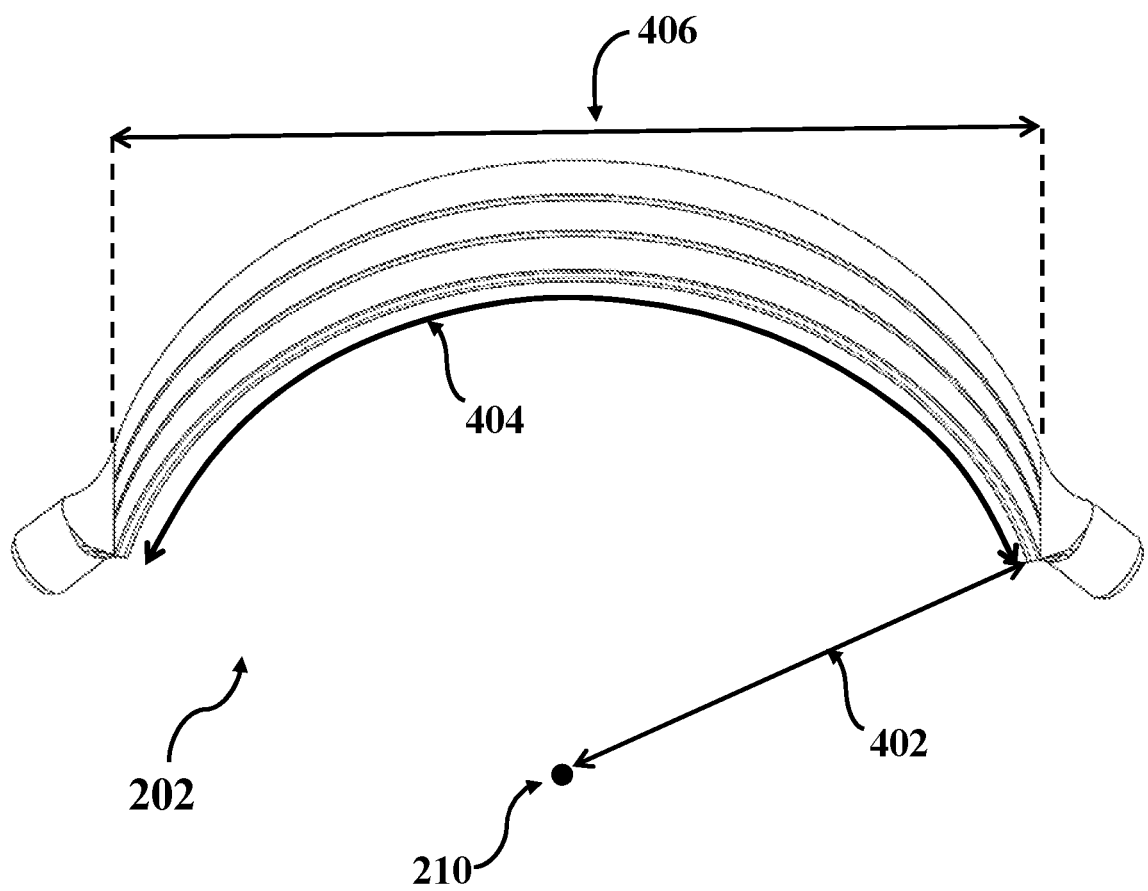
FIG. 4 illustrates a schematic view of an exemplary transmission line, consistent with one or more exemplary embodiments of the present disclosure.

FIG. 4 shows a schematic view of exemplary transmission line 202, consistent with one or more exemplary embodiments of the present disclosure. Referring to this figure, the curvature (C) of transmission line 202 may be defined as inverse of radius (R) 402 of transmission line 202 represented by Eq. 1:

$$C = 1/R [m^{-1}] \quad \text{Eq. 1}$$

Where R 402 may be calculated from Eq. 2:

$$\sin \frac{L}{2R} = \frac{X}{2R} \quad \text{Eq. 2}$$

Referring to FIG. 4, L is a length 404 of transmission line 202 and X is a straight distance 406 between two ends of transmission line 202. Using Taylor expansion of sine function for L«2R, R may be approximated by Eq. 3:

$$R = \frac{L\sqrt{L}}{2\sqrt{6(L-X)}} \quad \text{Eq. 3}$$

In an exemplary embodiment, the curvature (C) of transmission line 202 may have a magnitude less than about 50 $m^{-1}$ in order to eliminate any considerable side effects or undesirable effects on both input signal that may be received by transmission line 202 and output power that may be sent by transmission line 202.

In an exemplary embodiment, the curvature (C) of transmission line 202 may have a magnitude less than about 20 $m^{-1}$, so that a stopband depth of the output power may remain unchangeable or may change slightly while the central frequency may remain constant at a single magnitude. In another exemplary embodiment, the curvature (C) of transmission line 202 may have a magnitude between about 20 $m^{-1}$ and about 50 $m^{-1}$; thereby, resulting in improving the depth of the output power while maintaining an almost constant central frequency.

Referring back to FIG. 1B, step 114 of preparing exemplary sensor 200 may include fabricating the first semi-cylindrical dielectric 206 and the second semi-cylindrical dielectric 208 by laser cutting of a dielectric. With further reference to FIGS. 2A and 2B, semi-cylindrical dielectric structure 204 may form an electromagnetic bandgap (EBG) structure 204 loaded on transmission line 202. Exemplary semi-cylindrical dielectric structure 204 may include a first semi-cylindrical dielectric 206 that may be loaded on a first side of transmission line 202 at the second metal layer 214 and a second semi-cylindrical dielectric 208 that may be loaded on a second side of transmission line 202 at the first metal layer 212. Accordingly, transmission line 202 may be located or placed between the first semi-cylindrical dielectric 206 and the second semi-cylindrical dielectric 208.

In an exemplary implementation, semi-cylindrical dielectric structure 204 may be fabricated by laser cutting of a dielectric, for example, an optically transparent dielectric. In an exemplary embodiment, the first semi-cylindrical dielectric 206 and the second semi-cylindrical dielectric 208 may be fabricated using laser cutting of two pieces of polycarbonate dielectric to form semi-cylindrical dielectric structure 204.

In detail, step 116 may include placing the first semi-cylindrical dielectric 206 adjacent to a first side of transmission line 202. The first side of transmission line 202 may include an exterior surface of the second metal layer 214. In an exemplary embodiment, placing the first semi-cylindrical dielectric 206 adjacent to a first side of transmission line 202 may include placing the first semi-cylindrical dielectric 206 next to transmission line 202 with an air-space between the first semi-cylindrical dielectric 206 and transmission line 202. In an exemplary embodiment, the air-space between the first semi-cylindrical dielectric 206 and transmission line 202 may include an air-gap of about 10 μm or less.

Additionally, step 118 may include fixing the second semi-cylindrical dielectric 208 on a second side of transmission line 202. The second side of transmission line 202 may include an exterior surface of the first metal layer 212.

In an exemplary implementation, the first semi-cylindrical dielectric 206 may be rotatable around rotation axis 210 responsive to an angular displacement of an object, which may be a rotatable object in contact with sensor 200 via a contact with the first semi-cylindrical dielectric 206. In an exemplary embodiment, the first semi-cylindrical dielectric 206 may include a first plurality of periodic air-gaps 220.

In an exemplary implementation, the second semi-cylindrical dielectric 208 may be fixed or unmovable relative to rotation axis 210. The second semi-cylindrical dielectric 208 may be fixed on the first metal layer 212, so that the first semi-cylindrical dielectric 206 may easily rotate against the second semi-cylindrical dielectric 208 and transmission line 202, which may be fixed together. In an exemplary embodiment, the second semi-cylindrical dielectric 208 may include a second plurality of periodic air-gaps 222.

In an exemplary implementation, all air-gaps of the first plurality of periodic air-gaps 220 and all air-gaps of the second plurality of periodic air-gaps 222 may include the same length in a uniform manner. Additionally, each two adjacent air-gaps of the first plurality of periodic air-gaps 220, which may be located next to each other may a distance from each other equal to a distance between each two adjacent air-gaps of the second plurality of periodic air-gaps 222, which may be located next to each other. In an exemplar embodiment, referring to FIG. 1B, each two adjacent air-gaps 224 and 226 of the first plurality of periodic air-gaps 220 (FIG. 1A) may have the same length and the same distance apart from each other. Additionally, each two adjacent air-gaps 128 and 130 of the second plurality of periodic air-gaps 222 (FIG. 1A) may have the same length and the same distance apart from each other. Moreover, each air-gap 224 of the first plurality of periodic air-gaps 220 (FIG. 1A) may have an identical length to a length of each air-gap 228 of the second plurality of periodic air-gaps 222 (FIG. 1A).

In an exemplary embodiment, each two adjacent air-gaps 224 and 226 of the first plurality of periodic air-gaps 220 (FIG. 1A) may be equally spaced apart with the same distance between each two adjacent air-gaps 228 and 230 of the second plurality of periodic air-gaps 222 (FIG. 1A). So, each two adjacent air-gaps 224 and 226 of the first plurality of periodic air-gaps 220 (FIG. 1A) may have an identical distance from each other to a distance between each two adjacent air-gaps 228 and 230 of the second plurality of periodic air-gaps 222 (FIG. 1A).

Referring back to FIG. 1A, exemplary method 100 may further include sending a radio frequency (RF) signal as an input signal with a single central frequency to transmission line 202 (step 104). In an exemplary implementation, sending the RF signal with the single central frequency to transmission line 202 may include sending a RF signal with a single central frequency between about 1 GHz and about 30 GHz to transmission line 202.

In an exemplary embodiment, the input signal may include a radio frequency signal with a constant central frequency between about 1 GHz and about 30 GHz. Utilizing the constant central frequency may result in eliminating a need for sweeping a range of frequencies while measuring an angular displacement using exemplary sensor 200. A structural similarity between the first plurality of periodic air-gaps 220 and the second plurality of periodic air-gaps 222 as described above may allow for utilizing constant central frequency as the input signal. The structural similarity may include the same distance between each two adjacent air-gaps of the first plurality of periodic air-gaps 220 and the second plurality of periodic air-gaps 222. Hence, exemplary sensor 200 may be used for displacement measurements at only a single central frequency utilizing a VCO, which may overcome some difficulties due to working at a range of frequencies which may need using expensive and complicated VNA.

In an exemplary implementation, sending the RF signal with the single central frequency to transmission line 202 may be done using at least one of a vector network analyzer (VNA) and a voltage-controlled oscillator (VCO). In an exemplary embodiment, sending the RF signal with the single central frequency to transmission line 202 may include sending a RF signal with a single central frequency between about 1 GHz and about 30 GHz to transmission line 202 via the first coaxial RF connector 218a by connecting the first coaxial RF connector 218a to a voltage-controlled oscillator (VCO).

In detail, step 106 may include putting the first semi-cylindrical dielectric 206 in contact with a rotating object. The first semi-cylindrical dielectric 206 may be coupled to a rotating object, which may cause a rotation of the first semi-cylindrical dielectric 206 around rotation axis 210.

Additionally, step 108 may include displacing a position of a reference air-gap of the first plurality of periodic air-gaps 220 relative to the second plurality of periodic air-gaps 222 responsive to an angular displacement of the rotating object. In an exemplary embodiment, the angular displacement of the rotating object, which may be in contact with the first semi-cylindrical dielectric 206 may result in displacing the position of the reference air-gap of the first plurality of periodic air-gaps 220 relative to the second plurality of periodic air-gaps 222, which may include passing a number of air-gaps by the reference air-gap relative to the second plurality of periodic air-gaps 222.

Figure 5A:
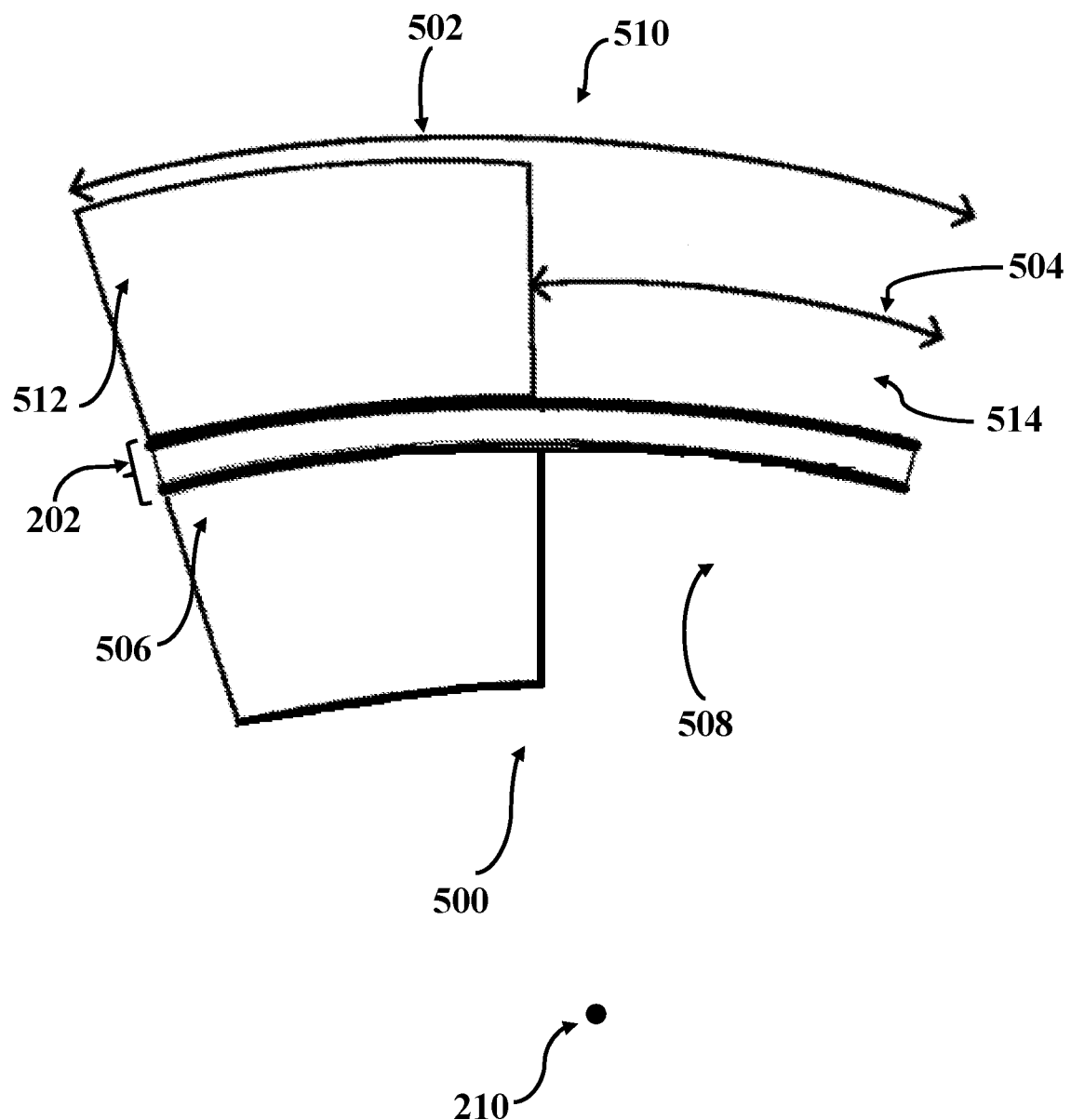
FIG. 5A illustrates a side-view of a situation of an exemplary periodic air-gap unit cell of a first semi-cylindrical dielectric, an exemplary periodic air-gap unit cell of a second semi-cylindrical dielectric, and exemplary transmission line before a rotation, consistent with one or more exemplary embodiments of the present disclosure.

FIG. 5A shows a side-view of a situation of an exemplary periodic air-gap unit cell 500 of the first semi-cylindrical dielectric 206, an exemplary periodic air-gap unit cell 510 of the second semi-cylindrical dielectric 208, and transmission line 202 before a rotation, consistent with one or more exemplary embodiments of the present disclosure. The first semi-cylindrical dielectric 206 may include a first plurality of unit cells. Exemplary unit cell 500 of the first plurality of unit cells may include a period length 502 of P may include an air-gap 508 and a dielectric 506, each with a length 504 of P/2. Correspondingly, the second semi-cylindrical dielectric 208 may include a second plurality of unit cells. Exemplary unit cell 510 of the second plurality of unit cells may include an air-gap 514 and a dielectric 512.

In an exemplary embodiment, the first plurality of unit cells may be located directly opposite to the second plurality of unit cells before the angular displacement of the rotating object that may cause a rotation of the first semi-cylindrical dielectric 206. For example, before a rotation, exemplary unit cell 500 of the first semi-cylindrical dielectric 206 may be located at a position directly opposite to exemplary corresponding unit cell 510 of the second semi-cylindrical dielectric 208.

It should be noted that a number of the first plurality of unit cells and the second plurality of unit cells, and the period length (P) 502 may directly influence the performance of sensor 200. In an exemplary embodiment, the number of the first plurality of unit cells and a number of the second plurality of unit cells may influence the sensitivity of sensor 200, for example, by giving a deeper stopband due to a larger number of the first and the second plurality of unit cells. For example, about 10 to 20 unit cells for the first and the second plurality of unit cells may be used. In another exemplary embodiment, the period length (P) 502 of unit cells may affect the single central frequency that may be sent to transmission line 202, and a range of angular measurement that may be obtained utilizing sensor 200. So, by selecting the number and the period length (P) 502 of unit cells, a dynamic range and sensitivity of sensor 200 may be adjusted.

In step 108, the position of the reference air-gap, for example, the position of exemplary air-gap 508 may be displaced against corresponding air-gap 514 responsive to the angular displacement of the rotating object. The angular displacement or a rotation of the rotating object may result in an angular displacement of unit cells 500.

Figure 5B:
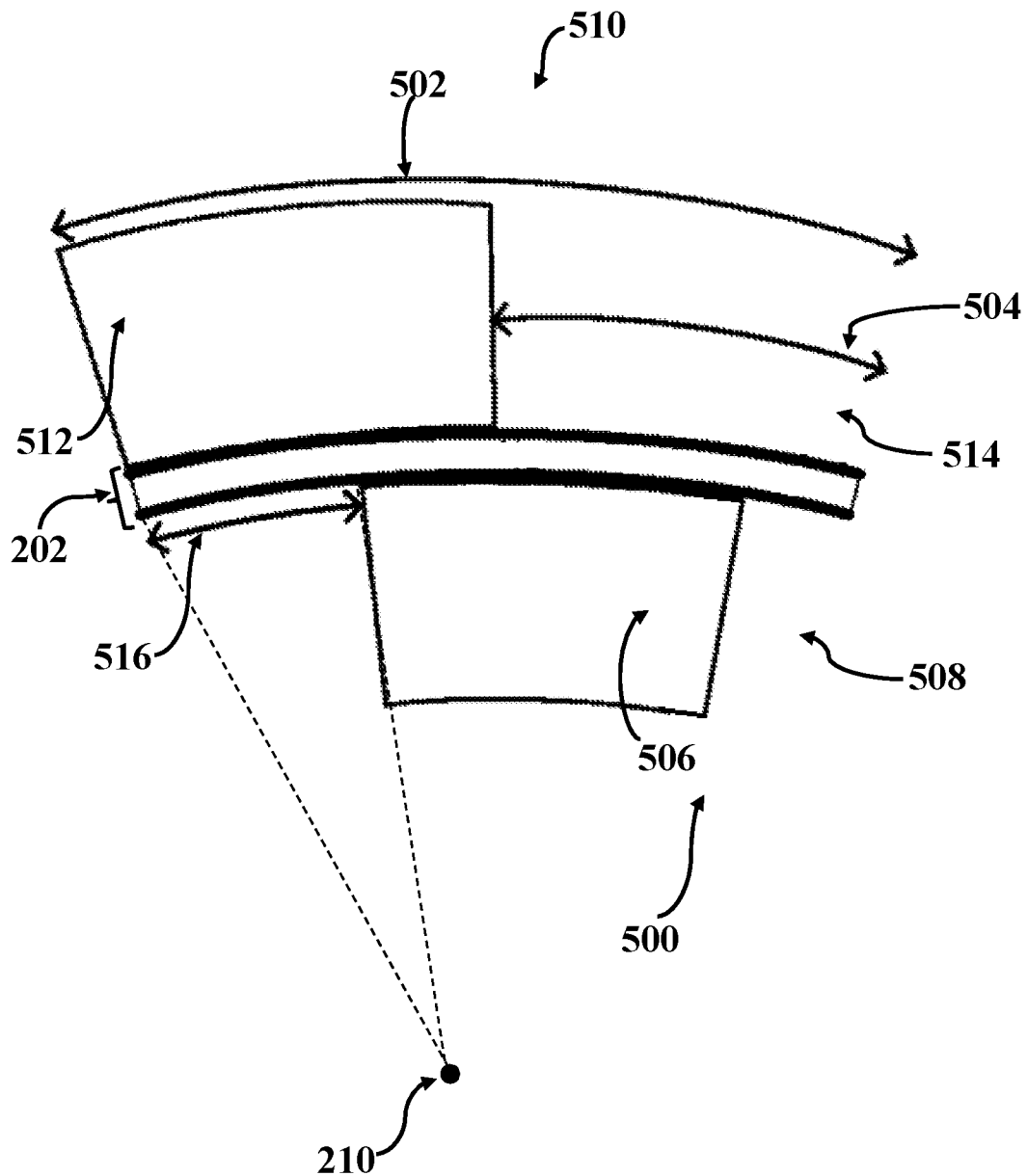
FIG. 5B illustrates a side-view of a situation of exemplary periodic air-gap unit cell of the first semi-cylindrical dielectric, exemplary periodic air-gap unit cell of a second semi-cylindrical dielectric, and exemplary transmission line after the angular displacement of the rotating object, consistent with one or more exemplary embodiments of the present disclosure.

FIG. 5B shows a side-view of a situation of exemplary periodic air-gap unit cell 500 of the first semi-cylindrical dielectric 206, an exemplary periodic air-gap unit cell 510 of the second semi-cylindrical dielectric 208, and transmission line 202 after the angular displacement of the rotating object, consistent with one or more exemplary embodiments of the present disclosure. In an exemplary implementation, the angular displacement of the rotating object may result in displacing a location of the first plurality of unit cells relative to the second plurality of unit cells that may include a rotation of exemplary unit cell 500 around rotation axis 210. In an exemplary embodiment, the angular displacement of the rotating object may result in a displacement of the position of the reference air-gap. The displacement of the position of the reference air-gap may include a radial displacement (Δα rotation 516) as well as an angular displacement equivalent to a number of the second plurality of periodic air-gaps 222 that may be passed by the reference air-gap responsive to the angular displacement of the rotating object.

In an exemplary embodiment, air-gap 508 may be displaced rotationally with an angle equal to the radial displacement (Δα rotation 516). In another exemplary embodiment, air-gap 508 may be displaced with an angular magnitude corresponding to a number of length 504 of P/2 of the second plurality of periodic air-gaps 222 that may be passed by exemplary air-gap 508 in addition to the radial displacement (Δα rotation 516).

Referring back to FIG. 1A, exemplary method 100 may further include determining the angular displacement of the rotating object (step 110). In one implementation, step 110 may include determining the angular magnitude corresponding to the number of length 504 of P/2 of the second plurality of periodic air-gaps 222 that may be passed by exemplary air-gap 508 in addition to the Δα rotation 516.

Figure 1C:
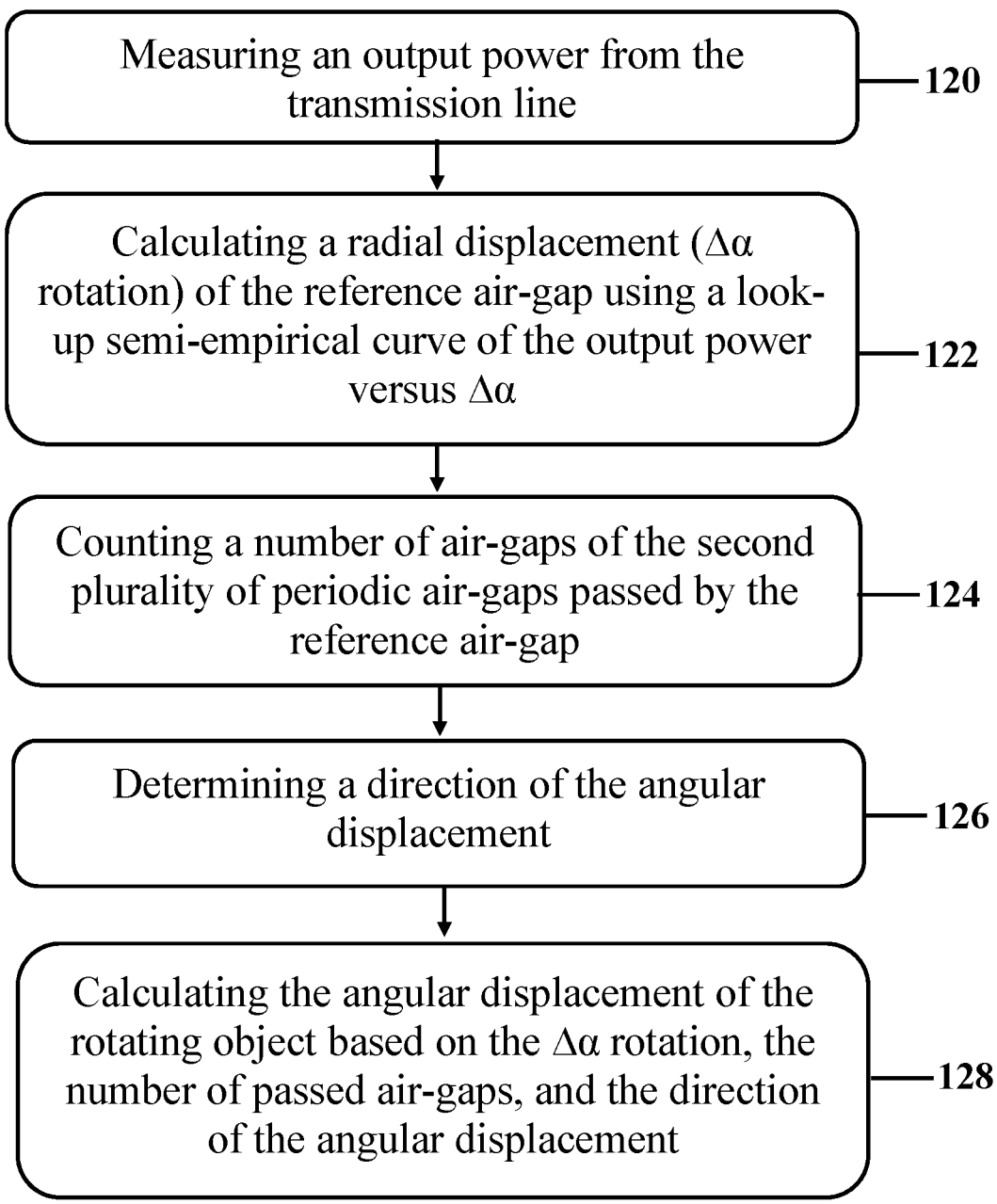
FIG. 1C illustrates an exemplary implementation of a process for determining angular displacement of a rotating object, consistent with one or more exemplary embodiments of the present disclosure.

FIG. 1C shows an exemplary implementation of a process for determining the angular displacement of the rotating object (step 110), consistent with one or more exemplary embodiments of the present disclosure. In an exemplary implementation, determining the angular displacement of the rotating object (step 110) may include measuring an output power from transmission line 202 (step 120), calculating Δα rotation 516 of the reference air-gap, for example, exemplary air-gap 508 using a look-up semi-empirical curve of the output power versus Δα (step 122), counting a number of air-gaps of the second plurality of periodic air-gaps 222 passed by the reference air-gap, for example, exemplary air-gap 508 responsive to displacing the position of exemplary air-gap 508 of the first plurality of periodic air-gaps 220 relative to the second plurality of periodic air-gaps 222 (step 124), determining a direction of the angular displacement (step 126), and calculating the angular displacement of the rotating object based on the Δα rotation 516, the number of passed air-gaps, and the direction of the angular displacement (step 128) using exemplary Eq. 4 described herein below.

In an exemplary implementation, measuring the output power from transmission line 202 (step 120) may include detecting an amount of insertion loss of transmission line 202 at the single central frequency of the RF signal sent to transmission line 202 in step 104. In an exemplary embodiment, the output power may include insertion loss (|S21|) through transmission line 202 at the single central frequency that may be received by transmission line 202 in step 104.

In an exemplary implementation, measuring the output power from transmission line 202 (step 120) may include detecting an amount of insertion loss of transmission line 202 at the single central frequency using a power detector. The power detector may be connected to transmission line 202 via the second coaxial RF connector 218b.

Figure 6:
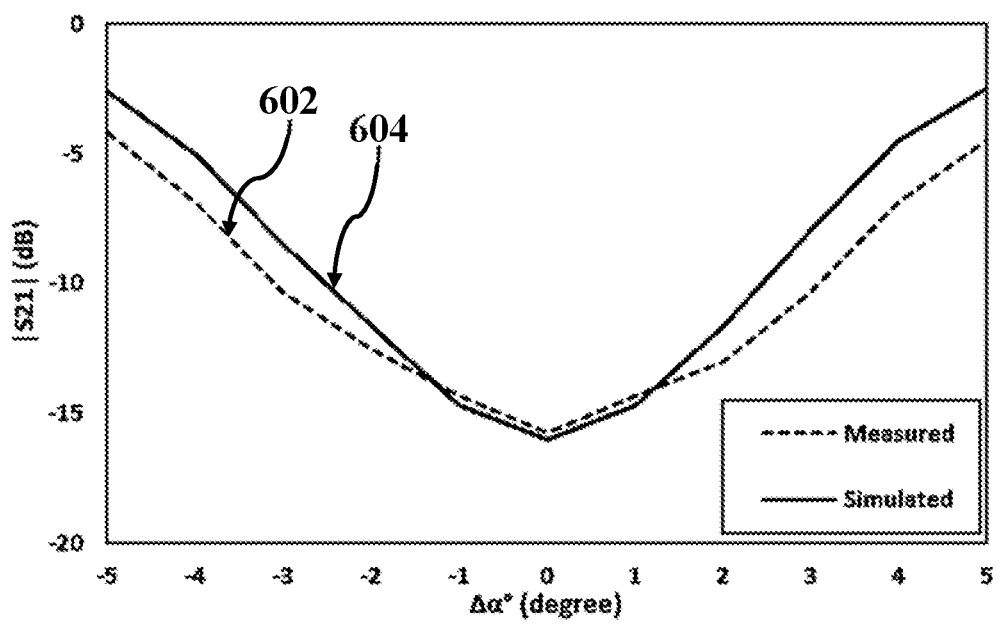
FIG. 6 illustrates exemplary look-up semi-empirical curves for reading $\Delta\alpha$ rotation based on the output power measured from transmission line for exemplary sensor with period length (P) equal to an angle of about 10° (degrees), consistent with one or more exemplary embodiments of the present disclosure.

In detail, step 122 may include calculating Δα rotation 516 of the reference air-gap, for example, exemplary air-gap 508 using a look-up semi-empirical curve of the output power versus Δα. FIG. 6 shows exemplary look-up semi-empirical curves for reading Δα rotation 516 based on the output power measured from transmission line 202 for exemplary sensor 200 with period length (P) 502 equal to an angle of about 10° (degrees), consistent with one or more exemplary embodiments of the present disclosure. Exemplary look-up semi-empirical curves in FIG. 6 may include a measured curve 602 of insertion loss (|S21|) at the single center frequency versus Δα, and a simulated curve 604 of insertion loss (|S21|) at the single center frequency versus Δα. In an exemplary embodiment, Δα rotation 516 may be read using look-up semi-empirical curves 602 and/or 604.

Referring to FIG. 6, a dynamic range of about 5° may be obtained for a maximum rotation equal to half of a unit cell 510 period (length 504 of P/2). For an angular displacement larger than 5°, due to the periodicity of the structure, the measured value may be repeated for each 5°. Therefore, the dynamic range of exemplary sensor 200 may be considerably increased by adding a counter circuit to obtain the number of the half periods (length 504 of P/2). It should be noted that |S21| of the odd half periods, similar to the first half period, may be increased by Δα rotation 516 but |S21| of the even half periods may be increased by p/2−Δα rotation 516. The measured curve 602 and simulated curve 604 of |S21| at the single central frequency for different rotation angles, are depicted in FIG. 6. It may be observed that exemplary sensor 200 may show an acceptable linear behavior with the straight line standard for the output of an ideal sensor function (operation). Consequently, by measuring the insertion loss (|S21|) one may extract Δα rotation 516 from the sensor response given in FIG. 6. Since the single central frequency may be almost fixed and independent of the rotation angle, no frequency sweeping may be needed and a simple and low-cost circuit may be utilized to extract the measured data.

Additionally, determining the angular displacement of the rotating object (step 110) may further include counting the number of air-gaps of the second plurality of periodic air-gaps 222 passed by the reference air-gap responsive to displacing the position of the reference air-gap of the first plurality of periodic air-gaps 220 relative to the second plurality of periodic air-gaps 222 (step 124). In an exemplary embodiment, the number of air-gaps of the second plurality of periodic air-gaps 222 that may be passed by exemplary air-gap 508 may include a number of length 504 of P/2 that may be passed by exemplary air-gap 508 during displacing the position of exemplary air-gap 508 of the first plurality of periodic air-gaps 220 relative to the second plurality of periodic air-gaps 222 responsive to the angular displacement of the rotating object (step 108). In an exemplary embodiment, the number of length 504 of P/2 that may be passed by exemplary air-gap 508 may be counted using a counter, which may be connected to the power detector. Accordingly, an angular displacement corresponding to the number of length 504 of P/2 that may be passed by exemplary air-gap 508 may include the number of length 504 of P/2 that may be passed by exemplary air-gap 508 multiplied by an angular equivalent of length 504 of P/2, for example 10° (degrees) for exemplary sensor 200 of FIG. 6.

Furthermore, determining the angular displacement of the rotating object (step 110) may include determining a direction of the angular displacement (step 126). In an exemplary embodiment, a potentiometer may be attached at a central axis of sensor 200, for example, rotation axis 210, to determine the direction of the angular displacement.

Additionally, step 128 may include calculating the angular displacement of the rotating object based on the Δα rotation 516, the number of passed air-gaps, and the direction of the angular displacement that may be determined through steps 122, 124, and 126, respectively. In an exemplary implementation, the angular displacement of the rotating object may be calculated from Eq. 4:

$$\text{angular displacement} = \text{direction}(n \times \alpha + \Delta\alpha \text{ rotation}) \qquad \text{Eq. 4}$$

In an exemplary embodiment, Δα rotation may include exemplary Δα rotation 516 that may be read from the look-up semi-empirical curve, n may include the number of passed air-gaps, direction may include a (+) or (−) sign, and a may include an angular equivalent of length 504 of P/2.

Figure 7:
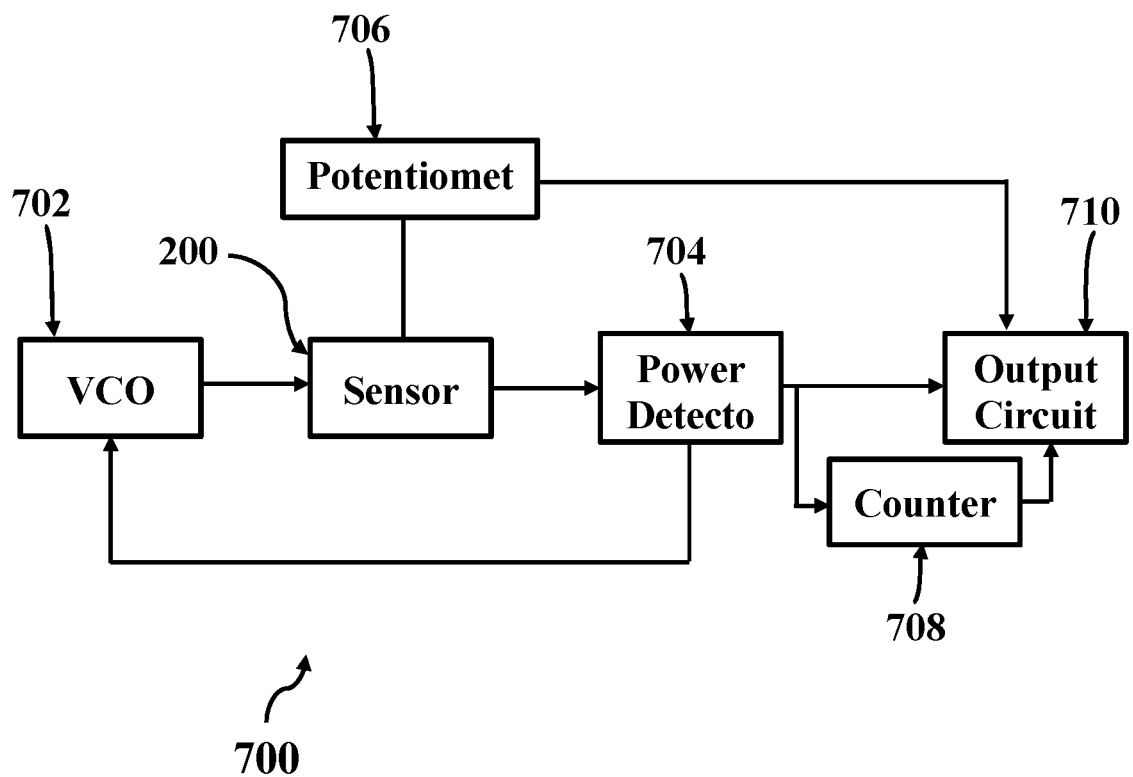
FIG. 7 illustrates a schematic view of an exemplary system for measuring angular displacement, consistent with one or more exemplary embodiments of the present disclosure.

In an exemplary implementation, method 100 may be utilized using a system for measuring angular displacement that may use exemplary sensor 200. FIG. 7 shows a schematic view of an exemplary system 700 for measuring angular displacement, consistent with one or more exemplary embodiments of the present disclosure. In an exemplary embodiment, system 700 may include exemplary sensor 200. As described in detail hereinabove, sensor 200 may include semi-cylindrical dielectric structure 204 that may include the first semi-cylindrical dielectric 206 that may be configured to rotate around rotation axis 210 responsive to the angular displacement of the rotating object, and the second semi-cylindrical dielectric 208 being fixed relative to rotation axis 210, and a transmission line 202 located or placed between the first semi-cylindrical dielectric 206 and the second semi-cylindrical dielectric 208. In an exemplary embodiment, as described in further detail above, the first semi-cylindrical dielectric 206 may include the first plurality of periodic air-gaps 220, and the second semi-cylindrical dielectric 208 may include the second plurality of periodic air-gaps 222. Sensor 200 may further include transmission line 202 that may be placed between the first semi-cylindrical dielectric 206 and the second semi-cylindrical dielectric 208. In an exemplary embodiment, transmission line 202 may be configured to receive the input signal and send the output power.

Additionally, system 700 may further include an exemplary voltage-controlled oscillator (VCO) 702 that may be connected to sensor 200. In an exemplary embodiment, VCO 702 may be configured to send the radio frequency (RF) signal with the single central frequency to transmission line 202. Exemplary VCO 702 may be utilized to send the input signal to transmission line 202, where the input signal may include a RF signal with a constant central frequency between about 1 GHz and about 30 GHz. In an exemplary embodiment, VCO 702 may be configured to send the RF signal with a constant central frequency to transmission line 202 at the minimum output power, which may eliminate an implementation of an expensive VNA to send the input signal to transmission line 202.

Furthermore, system 700 may include an exemplary power detector 704 that may be connected to sensor 200. In an exemplary embodiment, power detector 704 may be configured to receive the output power from transmission line 202 at the single central frequency.

Moreover, system 700 may include an exemplary potentiometer 706 that may be connected to sensor 200. In an exemplary embodiment, potentiometer 706 may be configured to determine a direction of the angular displacement of the rotating object.

Additionally, system 700 may include an exemplary counter 708 that may be coupled to power detector 704. In an exemplary embodiment, counter 708 may be configured to count a number of air-gaps of the second plurality of periodic air-gaps 222 passed by a reference air-gap, for example air-gap 508 (FIGS. 5A and 5B) of the first plurality of periodic air-gaps 220 responsive to the angular displacement of the rotating object. In an exemplary embodiment, counter 708 may be configured to count a number of half periods (P/2) that may be passed by exemplary air-gap 508.

In an exemplary implementation, system 700 may further include an exemplary output circuit 710 that may be connected to power detector 704, potentiometer 706 and counter 708. In an exemplary embodiment, output circuit 710 may be configured to calculate the angular displacement of the rotating object based on the output power, the direction of the angular displacement, and the number of passed air-gaps, for example, by using a formula such as Eq. 4.

Example 1: Sensor for Angular Displacement Measurements

In this example, a sensor similar to exemplary sensor 200 was fabricated utilizing exemplary methods described above with respect to method 100. The sensor that was fabricated included a microwave angular displacement sensor that may include a curved two-metal-layer coplanar waveguide (TML CPW) similar to transition line 202 loaded by an electromagnetic bandgap structure (EBG) similar to semi-cylindrical dielectric structure 204. The EBG included two semi-cylindrical periodic air-gap structures of dielectrics that were allocated at the top and bottom of the curved TML CPW. The curved TML CPW with the length of about 140 mm was fabricated on a 254 μm thick RO3010 Rogers substrate ($\varepsilon_r$=10.2 and tan δ=0.0022) which was arched in a semi-cylindrical shape with a radius of about 50 mm. The curved TML CPW included signal and ground traces with a length of about 1.5 mm, which were located about 800 μm apart each other. The thickness of each metal layer was about 18 μm. The RO3010 substrate with thickness of 254 μm may be adequately flexible to be easily curved with radius of about 50 mm (a curvature of about 20 $m^{-1}$). Two periodic air-gap structures similar to the first semi-cylindrical dielectric 206 and the second semi-cylindrical dielectric 208 were manufactured by laser cutting of an optically transparent polycarbonate ($\varepsilon_r$=2.8 and tan δ=0.01) in semi-cylindrical shapes with a height of about 5 mm for each air-gap. The air gaps were created with a period of α=10° degrees and the sensor included 15 unit cells similar to unit cells 500 or 510. Additional slots for screws were disposed on two periodic air-gap structures in such a way that the angle of the rotation may be adjusted alike the Vernier movement of a caliper at Δα=0°, 1°, 2°, 3°, 4° and 5°.

Figure 8:
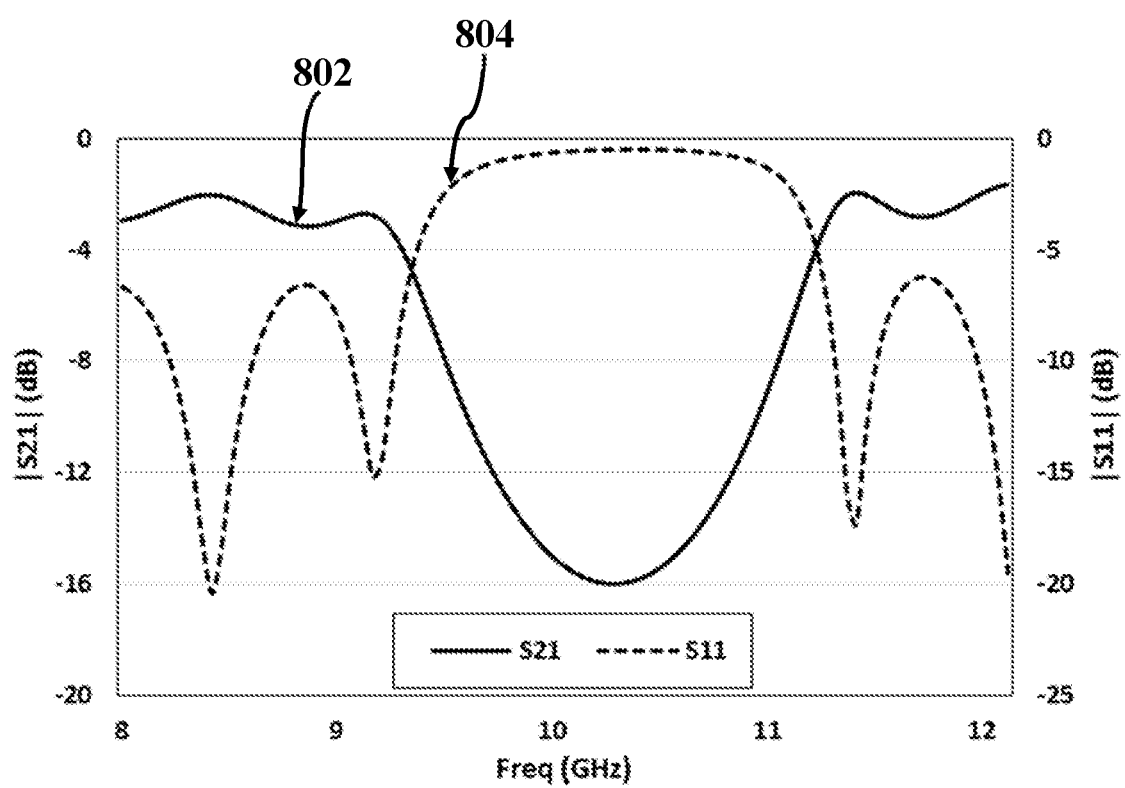
FIG. 8 illustrates simulation results of insertion loss at the single central frequency (|S21|) and reflection loss at the single central frequency (|S11|) for fabricated sensor at $\Delta\alpha=0°$, consistent with one or more exemplary embodiments of the present disclosure.

FIG. 8 shows simulation results of insertion loss at the single central frequency (|S21|) and reflection loss at the single central frequency (|S11|) for fabricated sensor at Δα=0°, consistent with one or more exemplary embodiments of the present disclosure. The simulated magnitudes S21 shown by curve 802 and S11 shown by curve 804 of the fabricated sensor for the state of Δα=0° may approve the EBG structure creation in the transmission line response. It may be observed that periodic air-gaps of the EBG structure may produce a stopband in the transmission coefficient. The stopband at Δα=0°, as a reference state for an exemplary sensor, shows the maximum insertion loss. By rotating the movable part (the first semi-cylindrical dielectric 206) of the fabricated sensor against the fixed parts (the second semi-cylindrical dielectric 208 and transmission line 202) for Δα 0°, the depth of the stopband may change proportionally with the angle of the rotation.

Table 1 shows characteristics of the fabricated sensor, including dynamic range of measurement, sensitivity, geometrical and electrical sizes, multiplication of dynamic range and sensitivity ($FOM_1$), and $FOM_1$ divided by sensor size ($FOM_2$). Where, (P/2=5°)×n may be the expected dynamic range if n half periods are added.

TABLE 1

Characteristics of the fabricated sensor

| Frequency (GHz) | Dynamic Range (degree) | Sensitivity (dB/degree) | Electrical Size | Size | $FOM_1$ (dB) | $FOM_2$ (dB/$\lambda^2$) | $FOM_2$ (dB/mm$^2$) |
|---|---|---|---|---|---|---|---|
| 10.2 | (P/2 = 5°) × n | 3 | ~0.5 × 0.5 $\lambda^2$ × (30 + n) | ~5 mm × 5 mm × (30 + n) | 15*n | 30 (for n = 30) | 0.3 (for n = 30) |

It may be observed from Table 1 that an average sensitivity of about 3 dB/degree and a dynamic range of about 5° degrees were obtained at 10.2 GHz. The average sensitivity of may depend on dielectric constant, the number of the unit cells, and the dielectrics thickness. It is worth noting that the dynamic range of the sensor may extend by increasing the period length and a longer period length may give a lower central frequency. Hence, a larger dynamic range may be used for a specific electrical length at lower operation frequencies.

Moreover, practical issues related to the fabricated sensor, such as the effect of air-space between the movable dielectric and the transmission line and ambient temperature variation of 75K (298K-373K) were also investigated which cause less than about 2% relative changes in the frequency of maximum insertion loss and only a 0.5 dB change in the |S21|.

Example 2: The Curvature Influences on the Sensor

Figure 9:
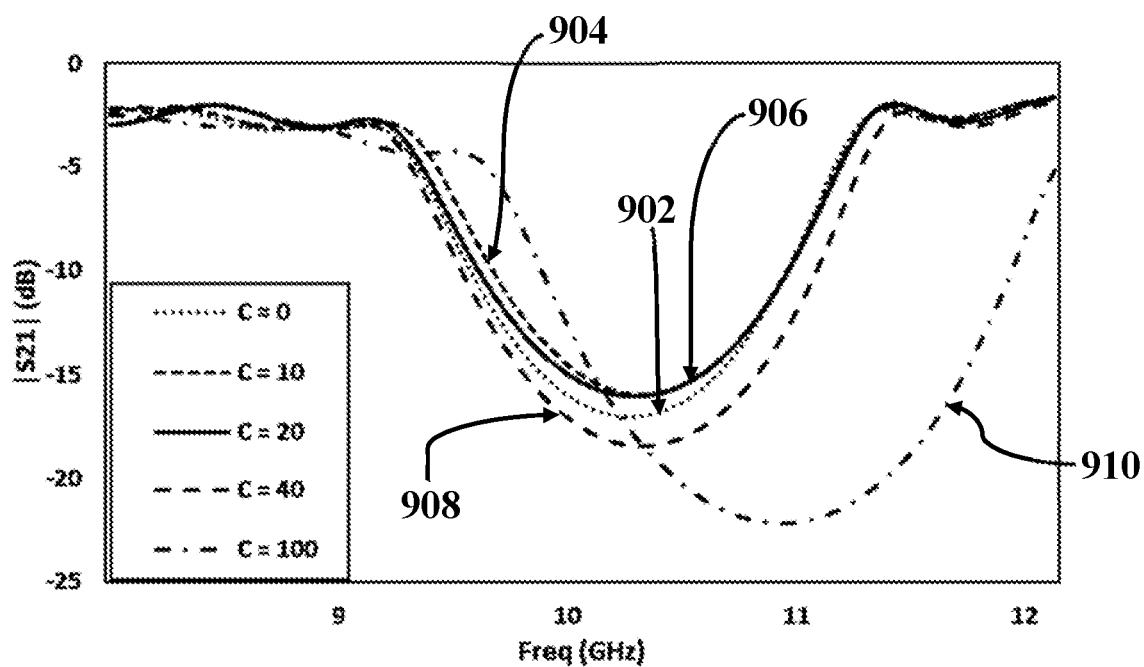
FIG. 9 illustrates the effect of the curvature (C=1/R) on |S21| of the simulated angular displacement sensor at $\Delta\alpha=0°$ at different curvatures of 0, 10, 20, 40, and 100, consistent with one or more exemplary embodiments of the present disclosure.

In this example, the impact of the curvature on the response of an exemplary sensor similar to sensor 200 was investigated as an important practical issue. FIG. 9 shows the effect of the curvature (C=1/R) on |S21| of the simulated angular displacement sensor at $\Delta\alpha=0°$ at different curvatures of 0 (curve 902), 10 (curve 904), 20 (curve 906), 40 (curve 908), and 100 (curve 910), consistent with one or more exemplary embodiments of the present disclosure. It may be observed that by increasing the curvature up to about 20 m$^{-1}$, the stopband depth in the |S21| may decrease only a little but the fundamental central frequency may be almost the same. For curvatures between about 20 m$^{-1}$ and about 50 m$^{-1}$, still the changes in the fundamental central frequency may be acceptable and even the stopband depth may be improved. For curvatures larger than about 50 m$^{-1}$, although the stopband depth may be further improved but the fundamental central frequency may change considerably. Therefore, these results may confirm that the curvatures of less than about 20 m$^{-1}$ may not cause any considerable influence on the sensor response.

Example 3: Measured and Simulated Results Using the Fabricated Sensor

In this example, the amount of |S21| at different angular displacements was monitored using both measured and simulated results. A VCO device may be utilized for measuring S-parameters with SOLT calibration, and the 3D full-wave FEM simulations were performed using HFSS software.

Figure 10:
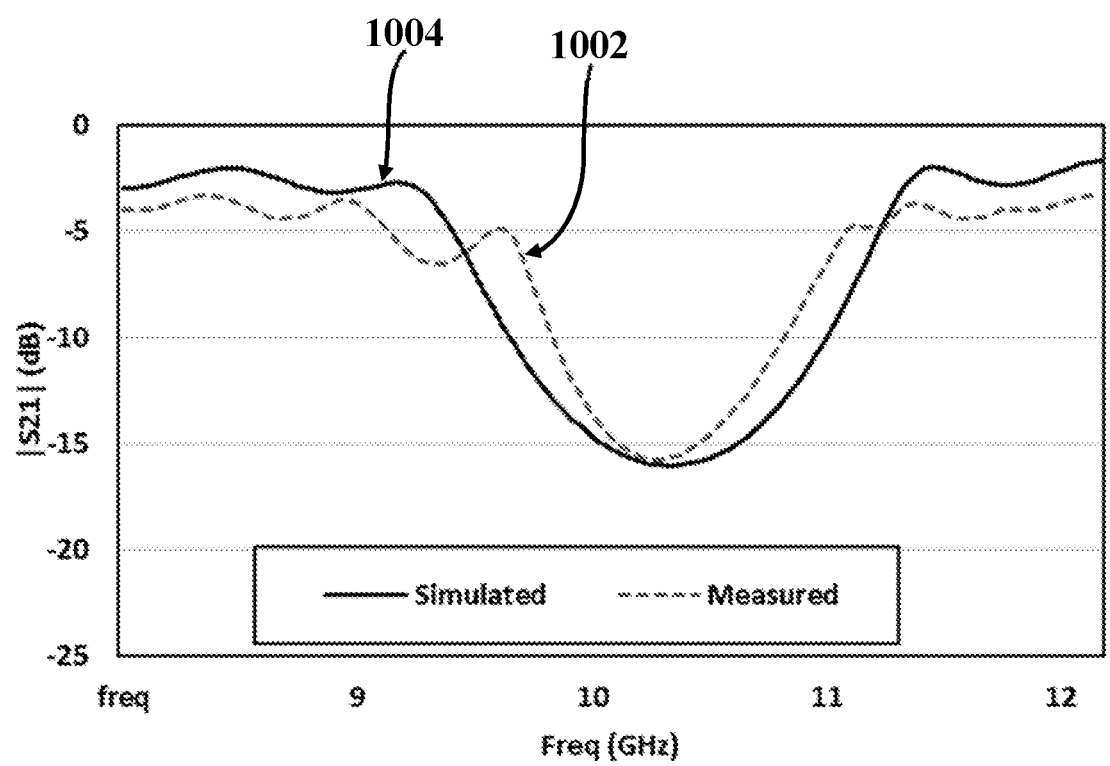
FIG. 10 illustrates the measured and simulated results of |S21| at $\Delta\alpha=0°$ for exemplary sensor, consistent with one or more exemplary embodiments of the present disclosure.

FIG. 10 shows the measured (curve 1002) and simulated (curve 1004) results of |S21| at $\Delta\alpha=0°$ for exemplary sensor 200, consistent with one or more exemplary embodiments of the present disclosure. Where, exemplary sensor 200 was fabricated in accordance with EXAMPLE 1. Referring to FIG. 10, the measured and simulated fundamental frequency for the maximum insertion loss of the stopband may take place at about 10.2 GHz for measured (curve 1002) data and about 10.24 GHz for simulated data (curve 1004). Rotating the movable part (the first semi-cylindrical dielectric 206) of the fabricated sensor against the fixed parts (the second semi-cylindrical dielectric 208 and transmission line 202) may change the depth of the stopband in S21 magnitude proportional to the angle of rotation.

Figure 11A:
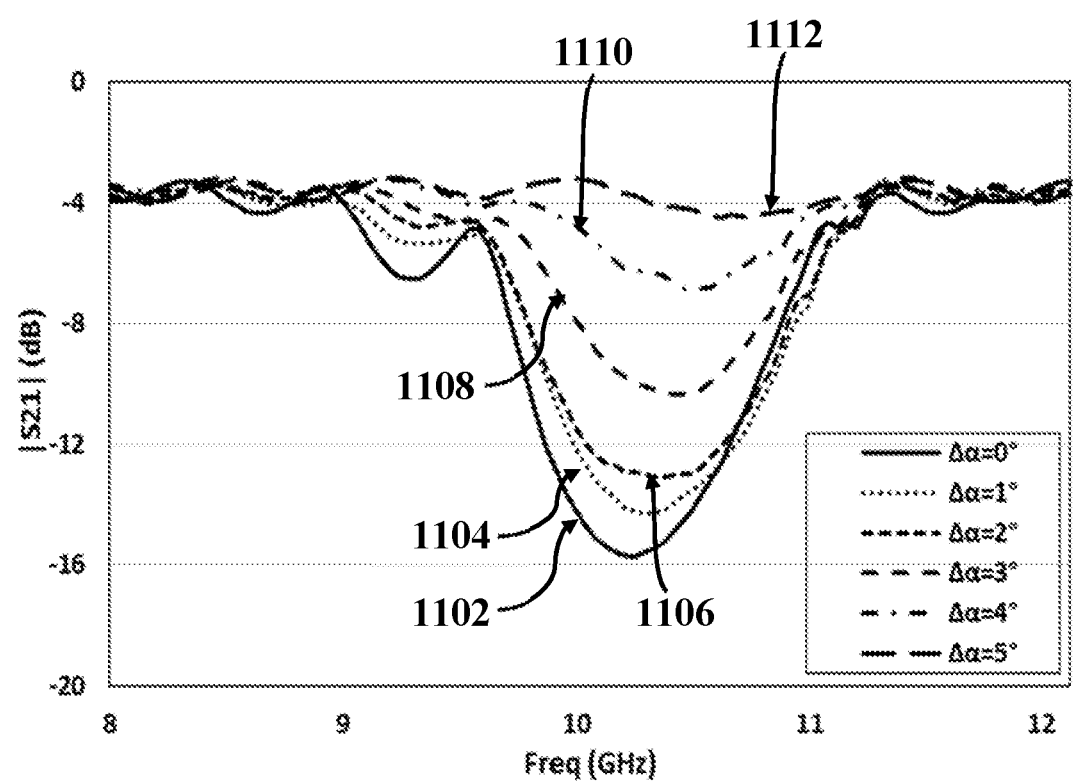
FIG. 11A illustrates a diagram presenting the measured results of |S21| at different $\Delta\alpha$ magnitudes of 0°, 1°, 2°, 3°, 4° and 5°, consistent with one or more exemplary embodiments of the present disclosure.
Figure 11B:
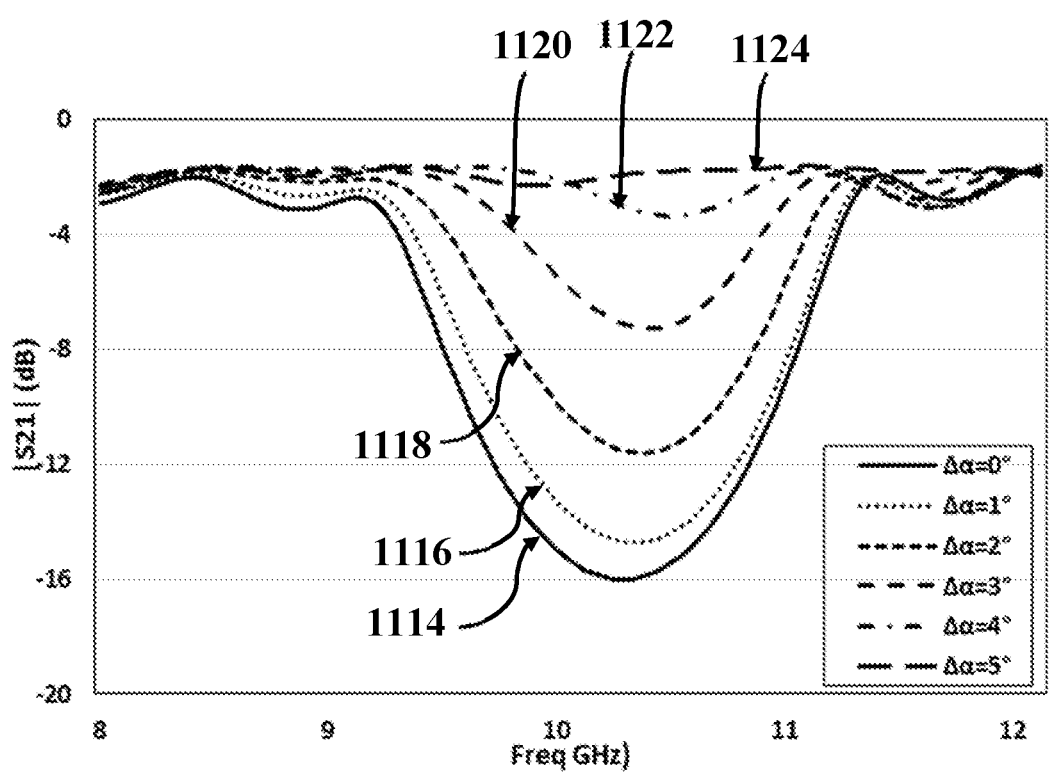
FIG. 11B illustrates a diagram presenting the simulated results of |S21| at different $\Delta\alpha$ magnitudes of 0°, 1°, 2°, 3°, 4° and 5°, consistent with one or more exemplary embodiments of the present disclosure.

Furthermore, the magnitude of |S21| was measured utilizing exemplary method 100 and simulated for various rotation angles ($\Delta\alpha=0°$, 1°, 2°, 3°, 4° and 5°). FIG. 11A shows a diagram presenting the measured results of |S21| at different $\Delta\alpha$ magnitudes of 0° (curve 1102), 1° (curve 1104), 2° (curve 1106), 3° (curve 1108), 4° (curve 1110) and 5° (curve 1112), consistent with one or more exemplary embodiments of the present disclosure. FIG. 11B shows a diagram presenting the simulated results of |S21| at different $\Delta\alpha$ magnitudes of 0° (curve 1114), 1° (curve 1116), 2° (curve 1118), 3° (curve 1120), 4° (curve 1122) and 5° (curve 1124), consistent with one or more exemplary embodiments of the present disclosure. It may be observed that both simulation and measurement results justify the correct operation of exemplary sensor 200 that was fabricated in accordance with EXAMPLE 1 and a good consistency between the simulation and measurement results may be obtained.

As a result, the lower and higher frequency band edges (with the limit of −10 dB) for the fabricated exemplary sensor 200 were obtained as being about 9.76 GHz and about 10.7 GHz, respectively. This may be a wide bandwidth of about 1 GHz for the sensor's stopband, which may be very useful for easy designing and fabricating an exemplary system similar to system 700 as a measurement data readout circuit. The fixed operating frequency and the wide bandwidth of the sensor (>1 GHz) may simplify the design and fabrication of the data readout circuit.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A method for measuring angular displacement, the method comprising:
   preparing a sensor, the sensor comprising:
   a cylindrical dielectric rotatable relative to a rotation axis, the cylindrical dielectric comprising a first plurality of periodic air-gaps;
   a semi-cylindrical dielectric fixed relative to the rotation axis, the semi-cylindrical dielectric comprising a second plurality of periodic air-gaps; and
   a transmission line located between the cylindrical dielectric and the semi-cylindrical dielectric;
   sending a radio frequency (RF) signal with a single central frequency to the transmission line;
   putting the cylindrical dielectric in contact with a rotating object;
   displacing a position of a reference air-gap of the first plurality of periodic air-gaps relative to the second plurality of periodic air-gaps responsive to an angular displacement of the rotating object; and
   determining the angular displacement of the rotating object.

2. The method of claim 1, wherein determining the angular displacement of the rotating object comprises:
   measuring an output power from the transmission line;
   calculating a radial displacement ($\Delta\alpha$ rotation) of the reference air-gap using a look-up semi-empirical curve of the output power versus $\Delta\alpha$;
   counting a number of air-gaps of the second plurality of periodic air-gaps passed by the reference air-gap responsive to displacing the position of the reference air-gap of the first plurality of periodic air-gaps relative to the second plurality of periodic air-gaps;
   determining a direction of the angular displacement; and
   calculating the angular displacement of the rotating object based on the $\Delta\alpha$ rotation, the number of passed air-gaps, and the direction of the angular displacement.

3. The method of claim 2, wherein measuring the output power from the transmission line comprises detecting an amount of insertion loss through the transmission line at the single central frequency.

4. The method of claim 1, wherein preparing the sensor comprises:
   fabricating the transmission line, comprising:
   preparing two metal layers, each metal layer comprising:
   a signal trace; and
   a pair of ground traces;
   putting a dielectric interlayer between the two metal layers; and
   bending the transmission line;
   fabricating the cylindrical dielectric and the semi-cylindrical dielectric by laser cutting of a dielectric;
   placing the cylindrical dielectric adjacent to a first side of the transmission line; and
   fixing the semi-cylindrical dielectric on a second side of the transmission line.

5. The method of claim 3, wherein bending the transmission line comprises bending the transmission line with a curvature less than 50 m$^{-1}$.

6. The method of claim 1, wherein sending the RF signal with a single central frequency to the transmission line comprises sending a RF signal with a constant central frequency between 1 GHz and 30 GHz using at least one of a vector network analyzer (VNA) and a voltage-controlled oscillator (VCO).

7. A sensor for measuring angular displacement, the sensor comprising:
   a transmission line configured to receive an input signal and send an output power, the transmission line comprising:

two curved metal layers; and
a dielectric interlayer between the two curved metal layers; and
a dielectric structure, comprising:
a cylindrical dielectric configured to rotate around a rotation axis responsive to an angular displacement of an object, the cylindrical dielectric comprising a first plurality of periodic air-gaps; and
a semi-cylindrical dielectric fixed relative to the rotation axis, the semi-cylindrical dielectric comprising a second plurality of periodic air-gaps,
wherein the transmission line is located between the cylindrical dielectric and the semi-cylindrical dielectric.

8. The sensor of claim 7, wherein the two curved metal layers comprise:
a first metal layer, comprising:
a first signal trace; and
a first pair of ground traces; and
a second metal layer, comprising:
a second signal trace connected to the first signal trace; and
a second pair of ground traces,
wherein each ground trace of the second pair of ground traces is connected to a corresponding ground trace of the first pair of ground traces.

9. The sensor of claim 8, wherein:
the first signal trace is located opposite to the second signal trace, and
each ground trace of the second pair of ground traces is located opposite to the corresponding connected ground trace of the first pair of ground traces.

10. The sensor of claim 8, wherein respective lengths of the first signal trace, the second signal trace, each ground trace of the first pair of ground traces, and each ground trace of the second pair of ground traces comprise the same length.

11. The sensor of claim 7, wherein the dielectric interlayer comprises a layer of flexible high-frequency Teflon-based material curved between the two curved metal layers.

12. The sensor of claim 7, wherein each two adjacent air-gaps of the first plurality of periodic air-gaps are equally spaced apart with the same distance between each two adjacent air-gaps of the second plurality of periodic air-gaps.

13. The sensor of claim 7, wherein each air-gap of the first plurality of periodic air-gaps and each air-gap of the second plurality of periodic air-gaps comprises the same length.

14. The sensor of claim 7, wherein a curvature of the transmission line is defined by the following $$C = \frac{2\sqrt{6(L-X)}}{L\sqrt{L}},$$

where
C is the curvature of the transmission line,
L is the length of the transmission line, and
X is the straight distance between two ends of the transmission line.

15. The sensor of claim 14, wherein the curvature of the transmission line comprises a magnitude less than 50 m$^{-1}$.

16. The sensor of claim 15, wherein the magnitude is more than 20 m$^{-1}$.

17. The sensor of claim 7, wherein the input signal comprises a radio frequency signal with a single central frequency between 1 GHz and 30 GHz.

18. The sensor of claim 17, wherein the output power comprises insertion loss through the transmission line at the single central frequency.

19. The sensor of claim 7, further comprising:
a first coaxial RF connector at a first end of the transmission line, the first coaxial RF connector configured to connect the transmission line to at least one of a vector network analyzer (VNA) and a voltage-controlled oscillator (VCO); and
a second coaxial RF connector at a second end of the transmission line, the second coaxial RF connector configured to connect the transmission line to a power detector.

20. A system for measuring angular displacement, the system comprising:
a sensor, comprising:
a dielectric structure, comprising:
a cylindrical dielectric configured to rotate around a rotation axis responsive to an angular displacement of a rotating object, the cylindrical dielectric comprising a first plurality of periodic air-gaps; and
a semi-cylindrical dielectric fixed relative to the rotation axis, the semi-cylindrical dielectric comprising a second plurality of periodic air-gaps; and
a transmission line located between the cylindrical dielectric and the semi-cylindrical dielectric, the transmission line configured to receive an input signal and send an output power;
a voltage-controlled oscillator (VCO) connected to the sensor, the VCO configured to send the input signal comprising a radio frequency (RF) signal with a single central frequency to the transmission line;
a power detector connected to the sensor, the power detector configured to receive the output power from the transmission line at the single central frequency;
a potentiometer coupled to the sensor, the potentiometer configured to determine a direction of the angular displacement of the rotating object;
a counter connected to the power detector, the counter configured to count a number of air-gaps of the second plurality of periodic air-gaps passed by a reference air-gap of the first plurality of periodic air-gaps responsive to the angular displacement of the rotating object; and
an output circuit connected to the power detector, the potentiometer, and the counter, the output circuit configured to calculate the angular displacement of the rotating object based on the output power, the direction of the angular displacement, and the number of passed air-gaps.

* * * * *